United States Patent
Yamada

(10) Patent No.: US 7,354,791 B2
(45) Date of Patent: Apr. 8, 2008

(54) SOLID-STATE IMAGING DEVICE, METHOD FOR MANUFACTURING THE SAME, AND METHOD FOR DRIVING THE SAME

(75) Inventor: Tooru Yamada, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 789 days.

(21) Appl. No.: 10/940,051

(22) Filed: Sep. 13, 2004

(65) Prior Publication Data
US 2005/0035376 A1    Feb. 17, 2005

Related U.S. Application Data

(62) Division of application No. 10/147,343, filed on May 16, 2002, now Pat. No. 6,809,359.

(30) Foreign Application Priority Data
May 16, 2001    (JP) .............................. 2001-146932

(51) Int. Cl.
*H01L 21/00*    (2006.01)
(52) U.S. Cl. .............................. 438/75; 438/70; 438/60; 438/73; 438/48; 257/290; 257/291; 257/292

(58) Field of Classification Search ................ 257/290, 257/291, 292; 438/70, 73, 75, 60, 48
See application file for complete search history.

(56) References Cited

FOREIGN PATENT DOCUMENTS

| JP | 4-333282 | 11/1992 |
|---|---|---|
| JP | 7-94699 | 4/1995 |
| JP | 9-82933 | 3/1997 |
| JP | 2000-77647 | 3/2000 |
| JP | 2000-174251 | 6/2000 |

*Primary Examiner*—Evan Pert
*Assistant Examiner*—Tan Tran
(74) *Attorney, Agent, or Firm*—Hamre, Schumann, Mueller & Larson P.C.

(57) ABSTRACT

In a solid-state imaging device in which a N-type photoelectric conversion region is formed in a $P^-$-type well region, a light-blocking film and a transparent conductive film are formed on the N-type photoelectric conversion region with a second interlayer insulation film interposed therebetween. By applying a negative voltage to the light-blocking film and the transparent conductive film, a $P^{++}$-type inversion region is formed in a topmost part of the N-type photoelectric conversion region.

7 Claims, 16 Drawing Sheets

US 7,354,791 B2

SOLID-STATE IMAGING DEVICE, METHOD FOR MANUFACTURING THE SAME, AND METHOD FOR DRIVING THE SAME

This application is a division of application Ser. No. 10/147,343, filed May 16, 2002, now U.S. Pat. No. 6,809,359 which application is incorporated herein by reference.

BACKGROUND OF THE INVENTION

1. Field of the Invention

The present invention relates to a solid-state imaging device, a method for manufacturing the same, and a method for driving the same.

2. Related Background Art

Solid-state imaging devices such as CCD solid-state imaging devices and MOS solid-state imaging devices that include photoelectric conversion sections for converting light into electric charges are employed in various image input devices such as facsimiles, video cameras, and digital still cameras.

FIG. 20 is a cross-sectional view illustrating an example of a structure of a pixel in a conventional solid-state imaging device (this solid-state imaging device is hereinafter referred to as "first conventional example"). In this first conventional example, a N-type photoelectric conversion region 103, a N-type transfer channel region 104, a P-type readout region 105, and a $P^+$-type channel stop region 106 are formed in a $P^-$-type well region 102 that is formed in a $N^-$-type silicon substrate 101. Further, a $P^{++}$-type hole accumulation region 107 is formed in a topmost part of the photoelectric conversion region 103, and a P-type well region 108 is formed immediately under the transfer channel region 104. A transfer electrode 111 is formed above the transfer channel region 104, the readout region 105, and the channel-stop region 106, with a gate insulation film 110 interposed therebetween. On a surface of the transfer electrode 111, a first interlayer insulation film 113 is formed. Further, a conductive light-blocking film 115 is formed thereon with a second interlayer insulation film 114 interposed therebetween. The conductive light-blocking film 115 is formed so as to cover the transfer electrode 111, and an opening 116 is provided at a position corresponding to at least a part of the photoelectric conversion region 103. Furthermore, generally the conductive light-blocking film 115 is grounded. Furthermore, a protective film 117, a flattening film 118, a color filter layer 119, and a microlens 120 are formed successively in the stated order.

FIG. 22 is a cross-sectional view illustrating another example of a conventional solid-state imaging device (this solid-state imaging device is hereinafter referred to as "second conventional example"). The second conventional example is disclosed in JP 7(1995)-94699 A, for instance. In the second conventional example, a transparent conductive film 121 is formed above the photoelectric conversion region 103 so as to be in direct contact with the $P^{++}$-type hole accumulation region 107. The transparent conductive film 121 is connected electrically with the conductive light-blocking film 115, which is grounded. The structure of the second conventional example is identical to that of the first conventional example except for where the transparent conductive film 121 is formed.

In the first and second conventional examples, as described above, the $P^{++}$-type hole accumulation region 107 is formed in a topmost part of the photoelectric conversion region 103. This allows dark current generated thermally on the surface of the photoelectric conversion region to be trapped by the holes in the $P^{++}$-type hole accumulation region 107, thereby improving the image quality of the solid-state imaging device. The $P^{++}$-type hole accumulation region 107 is a region in which P-type impurities are diffused at a high density, and which is formed by ion implantation.

FIG. 21 is a schematic view for explaining a method for forming the $P^{++}$-type hole accumulation region. First, the $P^-$-type well region 102 is formed in the $N^-$-type silicon substrate 101, and the N-type photoelectric conversion region 103 and the like are formed therein. Then, the transfer electrode 111 is formed on a surface of the silicon substrate 101 with the gate insulation film 110 interposed therebetween. Subsequently, the first interlayer insulation film 113 is formed on a surface of the transfer electrode 111, and thereafter, self-aligned ion implantation of a P-type impurity such as boron (B) or boron fluoride ($BF_2$) is carried out by using the transfer electrode 111 and the first interlayer insulation film 113 as masks. By so doing, the $P^{++}$-type hole accumulation region 107 is formed.

The foregoing first and second conventional examples have the following drawbacks. FIGS. 23 and 24 are schematic views for explaining the problems of the conventional solid-state imaging device, by referring to the configuration of the second conventional example.

In the first and second conventional examples, as described above, the $P^{++}$-type hole accumulation region 107 is formed by the self-aligned ion implantation of a P-type impurity by using the transfer electrode 111 and the first interlayer insulation film 113 as masks. The ion implantation is carried out with a high dose of $10^{13}$ to $10^{14}$ cm$^{-2}$ and with a low energy of several to several tens of kilo electron volts, so as to minimize the incurred erosion of the photoelectric conversion region 103 while efficiently suppressing the dark current generated at a surface of the substrate. Furthermore, the $P^{++}$-type hole accumulation region 107 is formed so as to cover a substantially entire face of the photoelectric conversion region 103.

It is however difficult to suppress the expansion of a range of the impurity distribution, even with the ion implantation of the P-type impurity with a low energy, because of the relatively high impurity density in the $P^{++}$-type hole accumulation region 107 as compared with the photoelectric conversion region 103, and the influence of the channeling upon the ion implantation and the annealing for activation after the implantation. Therefore, in the conventional solid-state imaging device, a junction depth ($X_j$) between the $P^{++}$-type hole accumulation region 107 and the photoelectric conversion region 103 is 0.3 μm normally, and it is very difficult to decrease the same.

Consequently, as shown in FIG. 23, a part of signal charges 122 generated by the photoelectric conversion easily flow as surface diffusion current 123 into the transfer channel region 104 via the $P^{++}$-type hole accumulation region 107, thereby causing the problem of an increase in smear. Furthermore, when the signal charges 122 are read out from the N-type photoelectric conversion region 103 to the N-type transfer channel region 104, a charge readout path 124 is formed, which sneaks around the $P^{++}$-type hole accumulation region 107. Therefore, the readout voltage increases.

Furthermore, problems as follows arise also. Since the $P^{++}$-type hole accumulation region 107 is formed spreading in a horizontal direction, a space 125 between the $P^{++}$-type hole accumulation region 107 and the transfer channel region is narrowed. As a result, when a readout pulse (normally about 15V) is applied to the transfer electrode 111 to read out the signal charges 122, hot electrons are generated by a strong electric field between the P$^{++}$-type hole accumulation region 107 and the N-type transfer channel 104, which cause random noise.

Furthermore, as shown in FIG. 24, in the second conventional example, since the transparent conductive film 121 is formed in direct contact with a surface of the silicon substrate in an area of a photoelectric conversion section 109, junction damage 126 occurs on the surface in the photoelectric conversion section 109. As a result, even with an attempt for suppressing the depletion of a topmost face by grounding the P$^{++}$-type hole accumulation region 107, dark current is increased through the junction damage 126, which degrades the image quality.

SUMMARY OF THE INVENTION

Therefore, it is an object of the present invention to provide a solid-state imaging device that allows for the decrease of smear, the decrease of a readout voltage, and the decrease of dark current, as well as to provide a method for manufacturing the same, and a method for driving the same.

To achieve the foregoing object, a first solid-state imaging device of the present invention includes: a second-conductivity-type photoelectric conversion region formed in a first-conductivity-type semiconductor substrate; an electrode formed on a region in the substrate with a gate insulation film interposed therebetween, the region being juxtaposed to the second-conductivity-type photoelectric conversion region; a conductive light-blocking film that covers the electrode and that has an opening above the second-conductivity-type photoelectric conversion region; and a transparent conductive film that is formed on the second-conductivity-type photoelectric conversion region with an interlayer insulation film interposed therebetween, and is connected electrically with the conductive light-blocking film.

In this solid-state imaging device, it is possible to form a first-conductivity-type inversion region in a topmost part of the second-conductivity-type photoelectric conversion region by applying a negative voltage to the conductive light-blocking film and the transparent conductive film.

In the first solid-state imaging device, the first-conductivity-type semiconductor region may be formed in the topmost part of the second-conductivity-type photoelectric conversion region. The first-conductivity-type semiconductor region formed in the topmost part of the photoelectric conversion region may be composed of an impurity diffusion region having a relative low density, for instance, $10^{16}$ to $10^{19}$ cm$^{-3}$, preferably $10^{17}$ to $10^{18}$ cm$^{-3}$. In this case, application of a voltage to the conductive light-blocking film and the transparent conductive film causes a first-conductivity-type accumulation region to be formed in a topmost part of the first-conductivity-type semiconductor region that is formed in the topmost part of the photoelectric conversion region.

In the foregoing first solid-state imaging device, it is preferable that the inversion region or the accumulation region has a depth of not more than 0.1 μm.

It should be noted that the foregoing first solid-state imaging device may be configured so that the transparent conductive film is formed on the conductive light-blocking film, but it preferably is configured so that the conductive light-blocking film is formed on the transparent conductive film.

Next, a first driving method of the present invention is a driving method for driving the first solid-state imaging device, and it includes the steps of: (a) accumulating signal charges generated by photoelectric conversion in the second-conductivity-type photoelectric conversion region, while transferring signal charges through the transfer channel region; and (b) reading out the accumulated signal charges into the transfer channel region. In the method, in the step (a), a negative voltage is applied to the conductive light-blocking film and the transparent conductive film, and in the step (b), a voltage of not less than 0 V is applied to the conductive light-blocking film and the transparent conductive film.

Furthermore, the first solid-state imaging device can be manufactured, for instance, by the following manufacturing method. The method includes: (a) forming a second-conductivity-type photoelectric conversion region in a first-conductivity-type semiconductor substrate; (b) forming an electrode on a region juxtaposed to the second-conductivity-type photoelectric conversion region in the substrate, with a gate insulation film interposed therebetween; (c) forming a conductive light-blocking film so as to cover the electrode and to have an opening above the second-conductivity-type photoelectric conversion region; and (d) forming a transparent conductive film on the second-conductivity-type photoelectric conversion region with an interlayer insulation film interposed therebetween, so as to be connected electrically with the conductive light-blocking film.

To achieve the foregoing object, a second solid-state imaging device of the present invention includes: a second-conductivity-type photoelectric conversion region formed in a first-conductivity-type semiconductor substrate, the second-conductivity-type photoelectric conversion region having a peripheral portion including a periphery thereof and a central portion excluding the periphery thereof; an electrode formed on a region juxtaposed to the second-conductivity-type photoelectric conversion region in the substrate with a gate insulation film interposed therebetween; a conductive light-blocking film that is formed above the peripheral portion of the second-conductivity-type photoelectric conversion region and above the electrode, with an interlayer insulation film interposed therebetween, and that has an opening above the central portion of the second-conductivity-type photoelectric conversion region; and a first-conductivity-type semiconductor region that is an impurity diffusion region formed in a topmost part in the central portion of the second-conductivity-type photoelectric conversion region.

In the foregoing solid-state imaging device, the application of a voltage to the conductive light-blocking film causes a first-conductivity-type inversion region to be formed in a topmost part of the peripheral portion of the second-conductivity-type photoelectric conversion region. The inversion region is formed normally so as to have has a depth of 0.1 μm or less.

Furthermore, in the second solid-state imaging device, a first-conductivity-type semiconductor region may be formed in a topmost part of the peripheral portion of the second-conductivity-type photoelectric conversion region. The first-conductivity-type semiconductor region formed in the topmost part of the peripheral portion of the photoelectric conversion region can be composed of an impurity diffusion region having a density sufficiently lower than that of the first-conductivity-type semiconductor region formed in the topmost part of the central portion of the photoelectric conversion region, for instance, a density of $10^{16}$ to $10^{19}$ cm$^{-3}$, preferably $10^{17}$ to $10^{18}$ cm$^{-3}$. In this case, the application of a voltage to the conductive light-blocking film causes a first-conductivity-type accumulation region to be formed in a topmost part of the first-conductivity-type semiconductor region formed in the topmost part of the peripheral portion of the photoelectric conversion region. It should be noted that the accumulation region is formed normally so as to have a depth of 0.1 μm or less.

Furthermore, in the second solid-state imaging device, a distance from an end of the second-conductivity-type photoelectric conversion region to an end of the first-conductivity-type semiconductor region formed in the topmost part of the central portion of the photoelectric conversion region preferably is not less than 0.3 μm.

Next, a second driving method of the present invention is a method for driving the second solid-state imaging device, and includes the steps of: (a) accumulating signal charges generated by photoelectric conversion in the second-conductivity-type photoelectric conversion region, while transferring signal charges through the transfer channel region; and (b) reading out the accumulated signal charges into the transfer channel region. In the step (a), a negative voltage is applied to the conductive light-blocking film, and in the step (b), a voltage of not less than 0 V is applied to the conductive light-blocking film.

Next, a second manufacturing method of the present invention is a method for manufacturing the second solid-state imaging device, and includes the steps of: (a) forming a second-conductivity-type photoelectric conversion region in a first-conductivity-type semiconductor substrate, the second-conductivity-type photoelectric conversion region having a peripheral portion including a periphery thereof and a central portion excluding the periphery thereof; (b) forming an electrode on a region juxtaposed to the second-conductivity-type photoelectric conversion region in the substrate, with a gate insulation film interposed therebetween; (c) forming a conductive light-blocking film above the peripheral portion of the second-conductivity-type photoelectric conversion region and above the electrode, with an interlayer insulation film interposed therebetween; (d) providing an opening in the conductive light-blocking film at a position corresponding to the central portion of the second-conductivity-type photoelectric conversion region; and (e) forming a first-conductivity-type semiconductor region in a topmost part of the central portion of the second-conductivity-type photoelectric conversion region by implanting ions of a first-conductivity-type impurity therein.

In the second manufacturing method, the step (e) preferably includes sub-steps of: forming a photoresist that covers the peripheral portion of the second-conductivity-type photoelectric conversion region and has an opening above the central portion of the second-conductivity-type photoelectric conversion region; and implanting ions of a first-conductivity-type impurity into the second-conductivity-type photoelectric conversion region, by using the photoresist as a mask.

Furthermore, in the second manufacturing method, the step (e) preferably includes the sub-steps of: forming a photoresist that covers at least one side part of the peripheral portion of the second-conductivity-type photoelectric conversion region and has an opening above the central portion of the second-conductivity-type photoelectric conversion region; and implanting ions of a first-conductivity-type impurity into the second-conductivity-type photoelectric conversion region in a direction tilted with respect to a face of the semiconductor substrate, by using the photoresist as a mask.

Furthermore, in the second manufacturing method, the step (e) preferably is carried out after the step (b) is carried out, and the step (e) preferably includes the sub-steps of: forming a side wall on a side face of the electrode; and implanting ions of a first-conductivity-type impurity into the second-conductivity-type photoelectric conversion region, by using the electrode and the side wall as masks.

Furthermore, the second manufacturing method preferably further includes the step of forming a first-conductivity-type semiconductor region in a topmost part of the second-conductivity-type photoelectric conversion region. The first-conductivity-type semiconductor region formed in the topmost part of the photoelectric conversion region can be composed of an impurity diffusion region having a density sufficiently lower than that of the first-conductivity-type semiconductor region formed in the topmost part of the central portion of the photoelectric conversion region, for instance, a density of $10^{16}$ to $10^{19}$ cm$^{-3}$, preferably $10^{17}$ to $10^{18}$ cm$^{-3}$.

Next, a third solid-state imaging device of the present invention includes: a second-conductivity-type photoelectric conversion region formed in a first-conductivity-type semiconductor substrate; a conductive light-blocking film that is formed on the substrate and has an opening above the second-conductivity-type photoelectric conversion region; and a transparent conductive film that is formed on the second-conductivity-type photoelectric conversion region with an interlayer insulation film interposed therebetween and that is connected electrically with the conductive light-blocking film.

Furthermore, a fourth solid-state imaging device of the present invention includes: a second-conductivity-type photoelectric conversion region formed in a first-conductivity-type semiconductor substrate, the second-conductivity-type photoelectric conversion region having a peripheral portion including a periphery thereof and a central portion excluding the periphery thereof, a conductive light-blocking film that is formed above the peripheral portion of the second-conductivity-type photoelectric conversion region with an interlayer insulation film interposed therebetween, and has an opening above the central portion of the second-conductivity-type photoelectric conversion region; and a first-conductivity-type semiconductor region that is an impurity diffusion region formed in a topmost part of the central portion of the second-conductivity-type photoelectric conversion region.

DETAILED DESCRIPTION OF THE INVENTION

Figure 1:
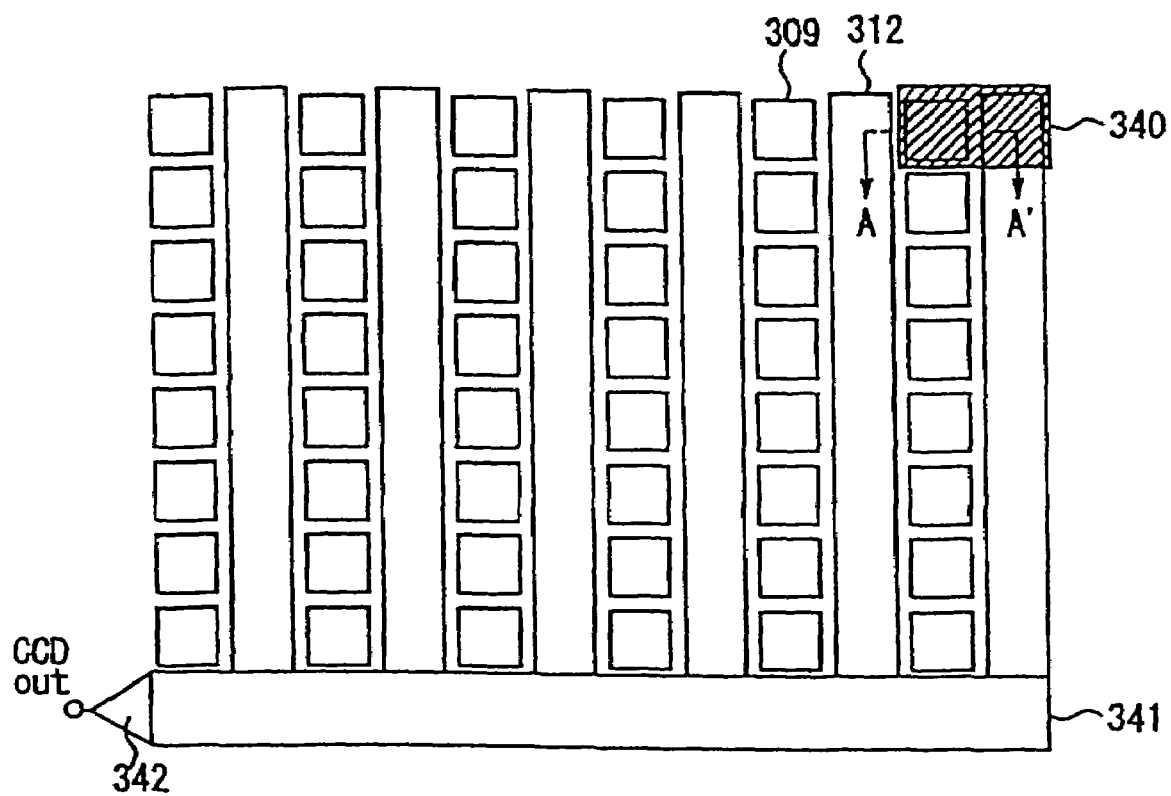
FIG. 1 is a schematic view illustrating a structure of a solid-state imaging device according to a first embodiment of the present invention.

The following will describe embodiments of the present invention, while referring to the drawings. It should be noted that the embodiments are described by taking a CCD solid-state imaging device as an example, but the present invention is not limited to this: the present invention is applicable to a MOS solid-state imaging device.

First Embodiment

FIG. 1 is a schematic view illustrating a configuration of a solid-state imaging device according to a first embodiment of the present invention. The solid-state imaging device is configured as follows. A plurality of photoelectric conversion sections 309 are arranged in matrix, and vertical transfer registers 312, each having a CCD structure, which transfer signal charges from the photoelectric conversion sections 309 in a vertical direction, are arranged so as to correspond to rows of the photoelectric conversion sections, respectively (this region is hereinafter referred to as "imaging region"). Furthermore, a horizontal transfer register 341 having a CCD structure, for transferring signal charges from the vertical transfer registers 312 in a horizontal direction, is arranged so as to be connected with ends of the vertical transfer registers 312, and an output section 342 is arranged at an end stage of the horizontal transfer register 341. It should be noted that 340 in the drawing denotes one pixel.

Figure 2:
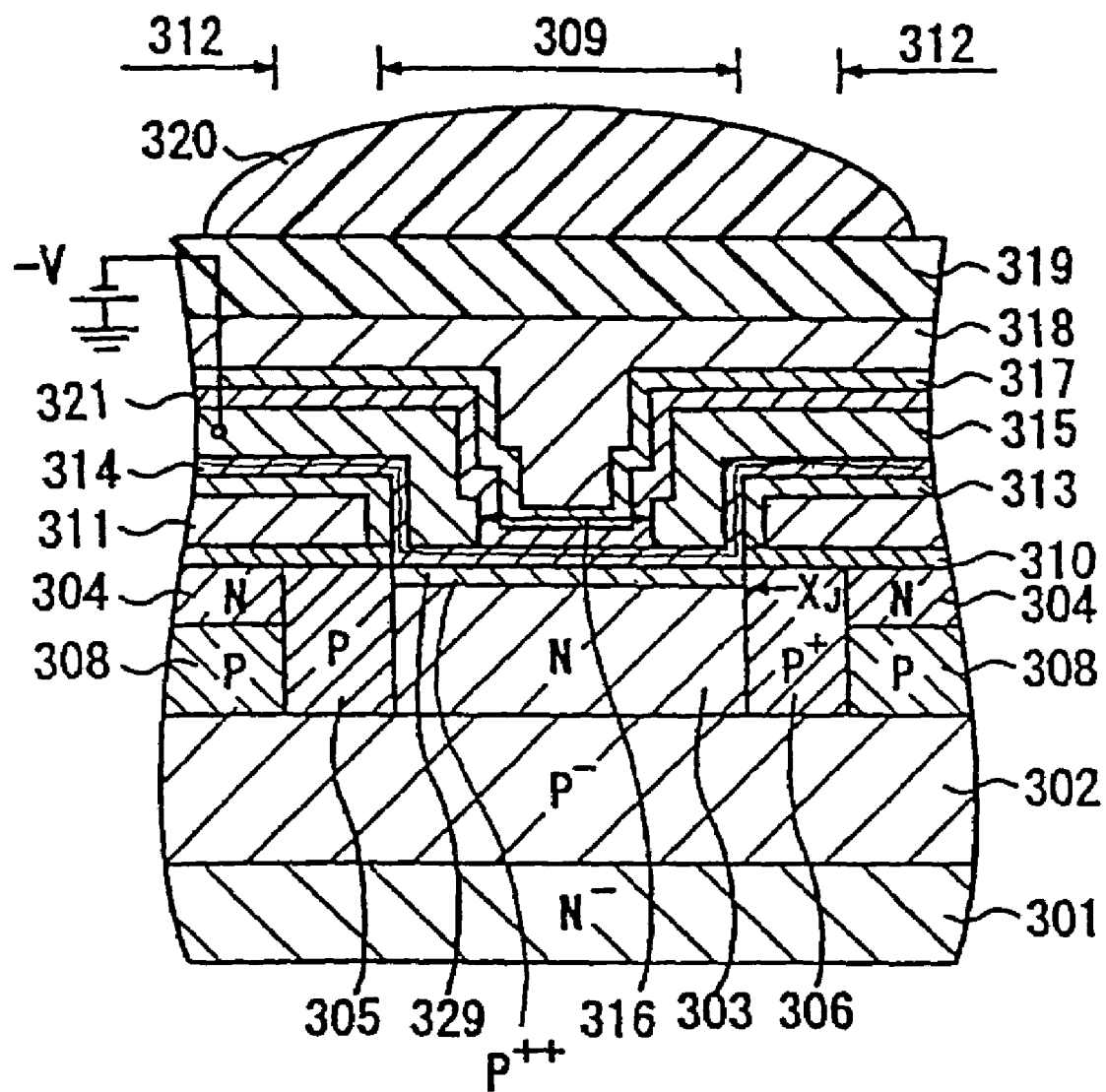
FIG. 2 is a cross-sectional view illustrating an example of the solid-state imaging device according to the first embodiment of the present invention.

FIG. 2 is a cross-sectional view illustrating an example of a configuration of the imaging region of the foregoing CCD solid-state imaging device, the cross-sectional view being taken along a line A-A' in FIG. 1.

A $P^-$-type well region 302 is formed in the $N^-$-type semiconductor substrate 301, and a N-type photoelectric conversion region 303 is formed in the $P^-$-type well region 302. A photodiode is provided by PN junction between the N-type photoelectric conversion region 303 and the $P^-$-type well region 302, and thus the photoelectric conversion section 309 is configured. The photoelectric conversion sections 309 are arranged so as to correspond to the pixels, respectively. Furthermore, an impurity density of the photoelectric conversion region 303 is not particularly limited, but it may be, for instance, $10^{15}$ to $10^{18}$ cm$^{-3}$, or preferably $10^{16}$ to $10^{17}$ cm$^{-3}$.

Furthermore, a N-type transfer channel region 304, a P-type readout region 305, and a $P^+$-type channel stop region 306 are formed in the $P^-$-type well region 302. Furthermore, immediately under each N-type transfer channel region 304, a P-type well region 308 is formed.

A transfer electrode 311 is formed above the N-type transfer channel region 304, the P-type readout region 305, and the $P^+$-type channel stop region 306, with a gate insulation film 310 interposed therebetween. The N-type transfer channel region 304, the gate insulation film 310, and the transfer electrode 311 constitute a vertical transfer register 312. For forming the gate insulation film 310, a silicon oxide film or a silicon nitride film, for instance, can be used. For forming the transfer electrode 311, for example, polycrystaline silicon can be used.

A first interlayer insulation film 313 is formed on a surface of the transfer electrode 311. For forming the first interlayer insulation film 313, a silicon oxide film or a silicon nitride film, for instance, can be used.

A second interlayer insulation film 314 is formed on the photoelectric conversion region 303 in the photoelectric conversion section 309, and on the first interlayer insulation film 311 in the vertical transfer register 312. For forming the second interlayer insulation film 314, a silicon oxide film or a silicon nitride film, for instance, can be used. The second interlayer insulation film 314 has a thickness of, for instance, 10 to 300 nm, preferably 50 to 150 nm.

Figure 3:
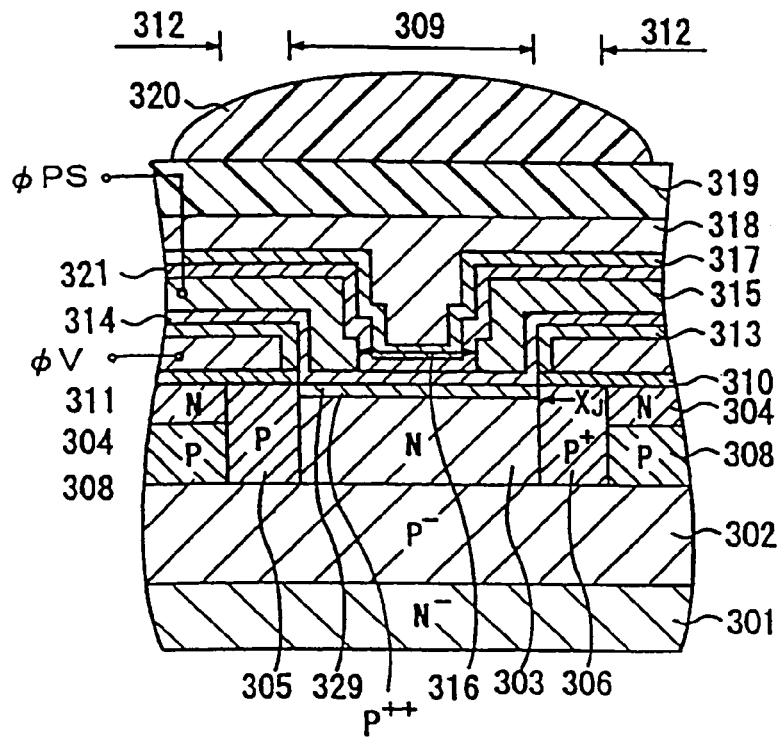
FIG. 3 is a cross-sectional view illustrating another example of the solid-state imaging device according to the first embodiment of the present invention.

A conductive light-blocking film 315 is formed on the second interlayer insulation film 314. The conductive light-blocking film 315 is formed to cover a surface of the transfer electrode 311 so that light should not be incident directly on the vertical transfer register 312, and an opening 316 is provided therein at a position above at least a part of the photoelectric conversion region 303. As shown in the drawing, the conductive light-blocking film 315 is connected electrically with a negative power source. Furthermore, as shown in FIG. 3, the conductive light-blocking film 315 may be arranged so that a driving pulse φPS is applied thereto. It should be noted that tungsten, aluminum, tungsten silicide, etc., for instance, can be used for forming the conductive light-blocking film 315.

A transparent conductive film 321 is formed on the conductive light-blocking film 315. Thus, on the photoelectric conversion region 303, the transparent conductive film 321 is formed in the opening 316 in the conductive light-blocking film, while the conductive light-blocking film 315 is formed in the other area, with the second interlayer insulation film 314 interposed therebetween. Furthermore, in the present embodiment, the transparent conductive film 321 and the conductive light-blocking film 315 are formed in direct contact with each other, and hence, they are electrically connected with each other.

For forming the transparent conductive film 321, indium tin oxide (ITO) or silicon, for instance, can be used. Furthermore, it is preferable to use a material having a refractive index between the refractive index of the semiconductor substrate and the refractive index of the protective film for forming the transparent conductive film 321, since this makes it possible to cause the transparent conductive film to function as a reflection preventing film, thereby allowing for the further reduction of smear and the improvement of sensitivity.

A protective film 317 is formed on the transparent conductive film 321, and a flattening film 318 is formed on the protective film 317. A silicon oxide film or a silicon nitride film, for instance, can be used for forming the protective film 317, and a silicon oxide film, a silicon nitride film, or a resin, for instance, can be used for forming the flattening film 318.

Furthermore, a color filter layer 319 is formed on the flattening film 318, and a microlens 320 is formed on the color filter layer 319 so as to correspond to each photoelectric conversion section 309.

In the solid-state imaging device of the present embodiment, the conductive light-blocking film 315 and the transparent conductive film 321 are formed on the photoelectric conversion region 303 with the second interlayer insulation film 314 interposed therebetween, thereby forming a MOS capacitor structure. With this configuration, the application of a negative voltage to the conductive light-blocking film 315 and the transparent conductive film 321 causes a $P^{++}$-type inversion region 329 to be formed in a topmost part of the photoelectric conversion region 303. The $P^{++}$-type inversion region 329 formed by the voltage application performs a function in trapping dark current generated on the substrate surface in the photoelectric conversion section 309. The depth ($X_J$) of the $P^{++}$-type inversion region 329 is, for instance, not more than 0.1 µm, preferably not more than 0.05 µm. Furthermore, the hole density is, for instance, not less than $10^{17}$ cm$^{-3}$, preferably $10^{18}$ to $10^{19}$ cm$^{-3}$. Furthermore, the negative voltage applied to the conductive light-blocking film 315 and the transparent conductive film 321 is not particularly limited, but preferably is set so that the hole density of the $P^{++}$-type inversion region 329 falls in the aforementioned range. More specifically, the negative voltage can be set to be, for instance, −1 to −10V, preferably −2 to −8 V.

Figure 4:
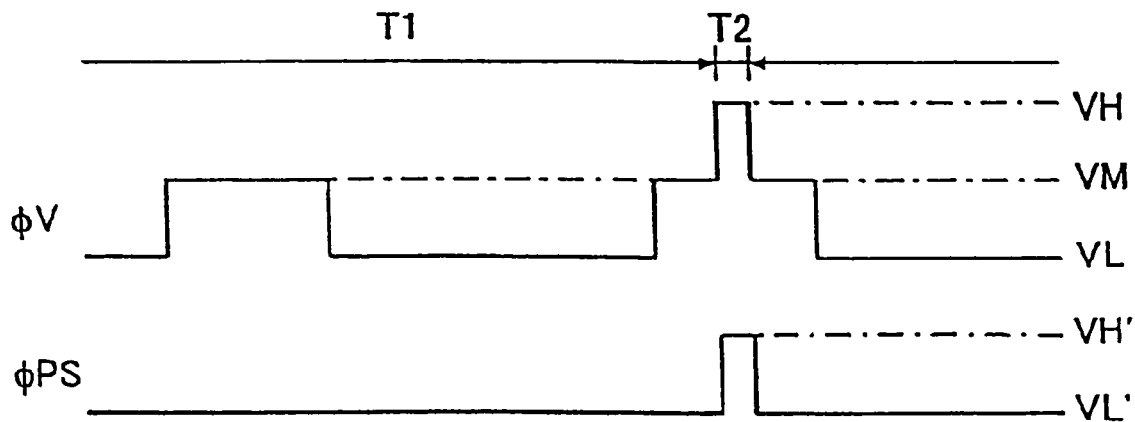
FIG. 4 is a timing chart illustrating an example of a driving method for driving the solid-state imaging device according to the first embodiment of the present invention.

Next, an example of a preferred driving method of the solid-state imaging device according to the present embodiment is described below, with reference to FIG. 4. It should be noted that the driving method described here is a method applied to a solid-state imaging device as shown in FIG. 3, that is, a solid-state imaging device configured so that a driving pulse φPS is applied to the conductive light-blocking film 315.

In the solid-state imaging device, light is incident on the photoelectric conversion region 303, and is subjected to photoelectric conversion, thereby generating signal charges. The signal charges thus generated are accumulated in the photoelectric conversion region 303. Then, the accumulated signal charges are read out into the transfer channel region 304, and are transferred.

φV denotes a pulse applied to the transfer electrode 311 of the charge transfer section, which is, for example, a ternary pulse having a high level VH (for example, 12V), a middle level VM (for example, 0V), and a low level VL (for example, −8V). The transfer electrode 311 to which the pulse φV is applied carries out a readout operation for reading out signal charges accumulated in the photoelectric conversion region 303 to the transfer channel region 304, and a transfer operation for transferring the readout signal charges through the transfer channel region 308. For instance, the application of the pulse at the high level VH to the transfer electrode causes signal charges to be read out from the photoelectric conversion region 303 to the transfer channel region 304. Then, the repetitive application of the pulse at the middle level VM and the pulse at the low level VL causes the charges to be transferred through the transfer channel region 304.

φPS denotes a pulse applied to the conductive light-blocking film 315 and the transparent conductive film 321, which is, for instance, a binary pulse having a high level VH' (for example, 12V), and a low level VL' (for example, −8V). The application of the pulse at the low level VL' to the conductive light-blocking film 315 and the transparent conductive film 321 causes the $P^{++}$-type inversion region 329 to be formed in the topmost part of the photoelectric conversion region 303, which functions as a hole accumulation region for trapping dark current.

As shown in the drawing, the pulses at the middle level VM and at the low level VL are applied to the transfer electrode 311, and during a time (T1) while the charge transfer is carried out, the pulse at the low level VL' is applied to the conductive light-blocking film 315 and the transparent conductive film 321. The time T1 is a time in which signal charges are accumulated in the photoelectric conversion region 303. During the time T1, as described above, the $P^{++}$-type inversion region 329 is formed in the topmost part of the photoelectric conversion region 303, with which the occurrence of dark current or smear is suppressed. On the other hand, during a time (T2) in which the pulse at the high level VH is applied to the transfer electrode 311 and signal charges are read out from the photoelectric conversion region 303 to the transfer channel region 304, the pulse at the high level VH' is applied to the conductive light-blocking film 315 and the transparent conductive film 321. Therefore, since the potential in the vicinity of the surface of the photoelectric conversion region 303 is deepened, it is possible to carry out the readout of signal charges at a further lower voltage.

It should be noted that the driving method of the solid-state imaging device according to the present embodiment is not limited to the foregoing method. It suffices that at least during a period while signal charges are accumulated in the photoelectric conversion region, a negative voltage is applied to the conductive light-blocking film and the transparent conductive film. For instance, as shown in FIG. 2, a negative constant voltage may be applied to the conductive light-blocking film and the transparent conductive film. In this case, the negative power source used for operating the solid-state imaging device may be used for generating the negative constant voltage, so as to prevent an increase in the number of circuits.

Figure 5:
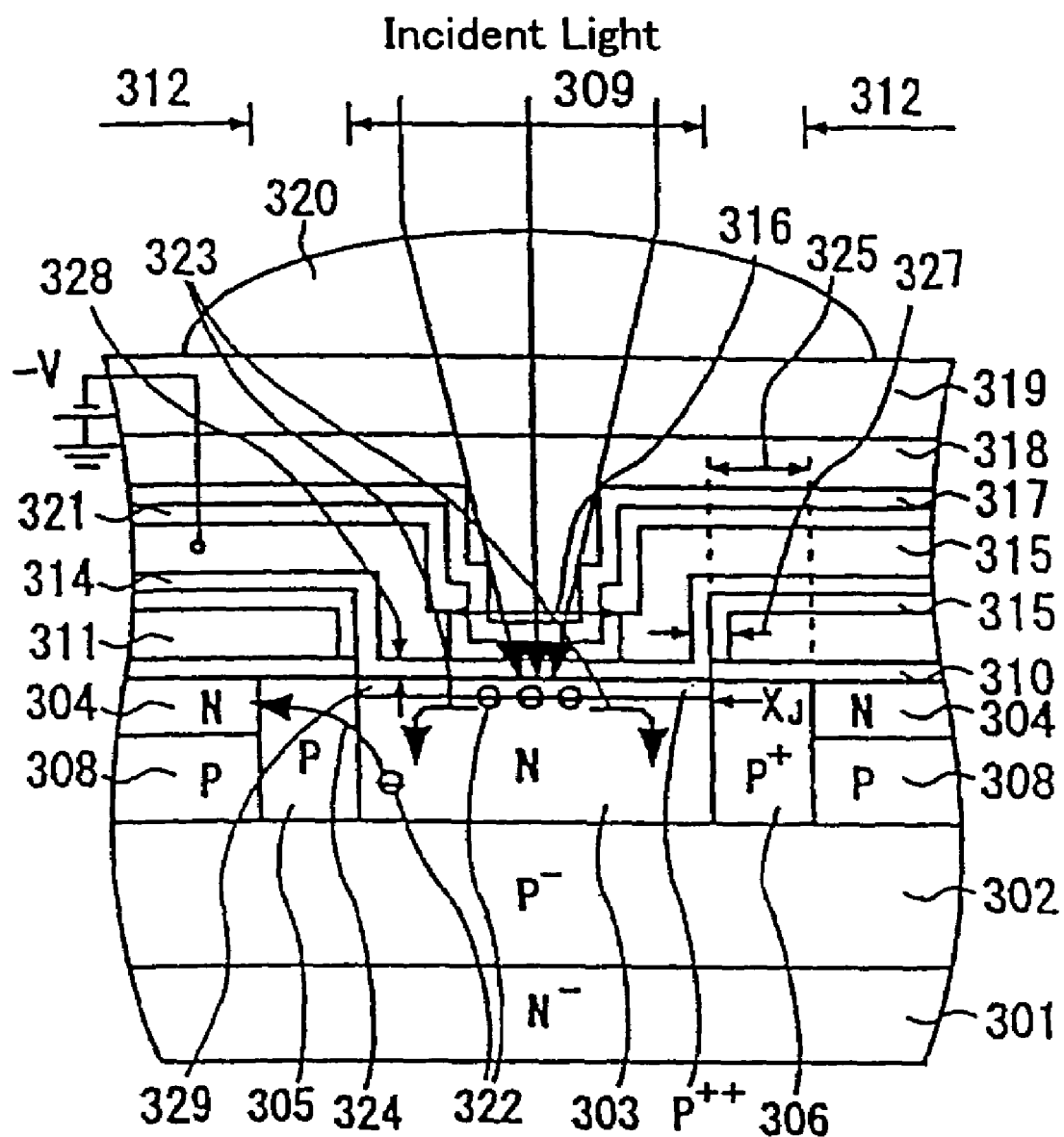
FIG. 5 is a schematic view for explaining effects achieved by the solid-state imaging device according to the first embodiment of the present invention.

Next, effects achieved by the solid-state imaging device according to the present embodiment are described below, with reference to FIG. 5.

Figure 20:
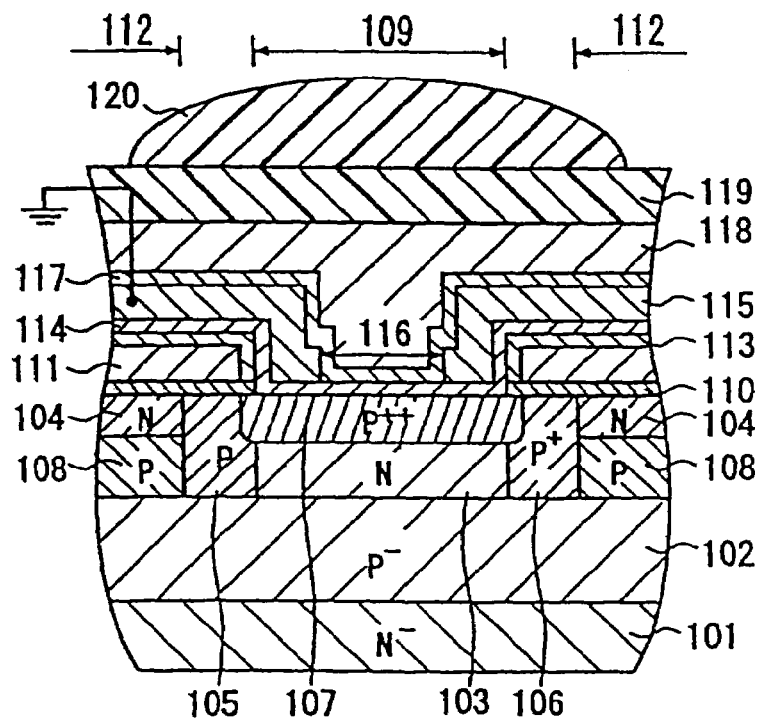
FIG. 20 is a cross-sectional view illustrating a structure of a solid-state imaging device of a first conventional example.
Figure 21:
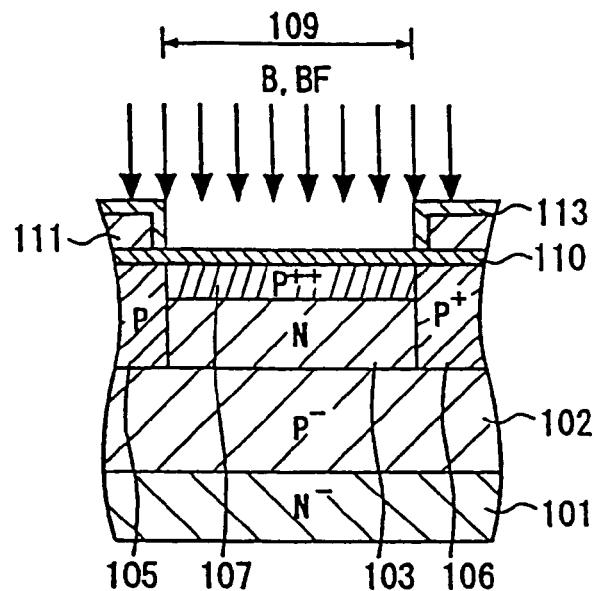
FIG. 21 is a schematic view illustrating a method for forming a conventional photoelectric conversion section.
Figure 22:
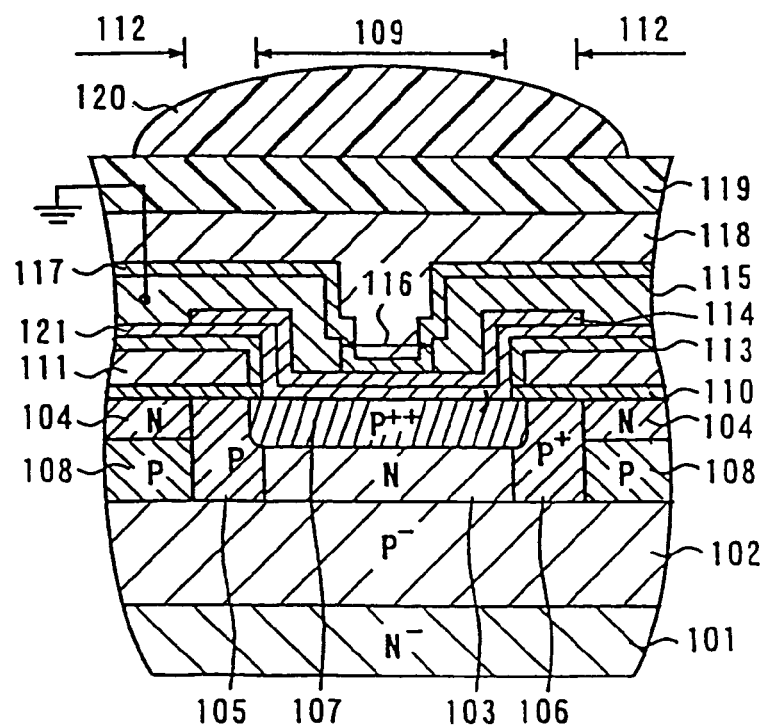
FIG. 22 is a cross-sectional view illustrating a structure of a solid-state imaging device according to a second conventional example.
Figure 23:
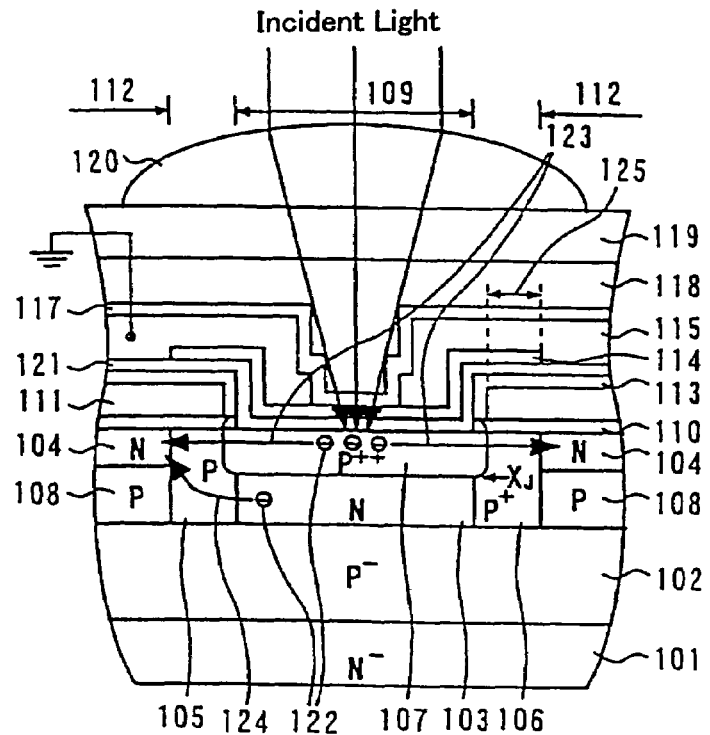
FIG. 23 is a schematic view for explaining a problem of a conventional solid-state imaging device.
Figure 24:
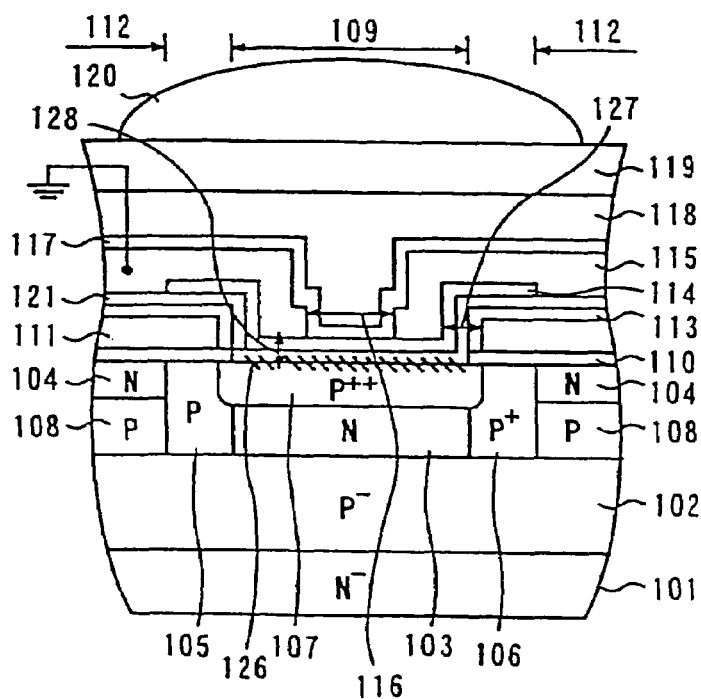
FIG. 24 is a schematic view for explaining a problem of a conventional solid-state imaging device.

In a conventional solid-state imaging device, a hole accumulation region for trapping dark current (107 in FIGS. 20 and 22) is formed by implanting ions of a P-type impurity. Therefore, there is a limitation on the reduction of the depth of the conventional hole accumulation region, and it is very difficult to reduce the depth to 0.2 µm or less. It should be noted that the depth of the conventional hole accumulation region is 0.3 µm generally.

In contrast, in the solid-state imaging device according to the present embodiment, as described above, it is possible to form the $P^{++}$-type inversion region 329 by applying a negative voltage to the light-blocking film 315 and the transparent conductive film 321, and to make the $P^{++}$-type inversion region 329 function as a hole accumulation region for trapping dark current. Therefore, it is possible to reduce the depth of the hole accumulation region to, for instance, 0.1 µm or less. As a result, the following effects can be achieved.

Figure 6:
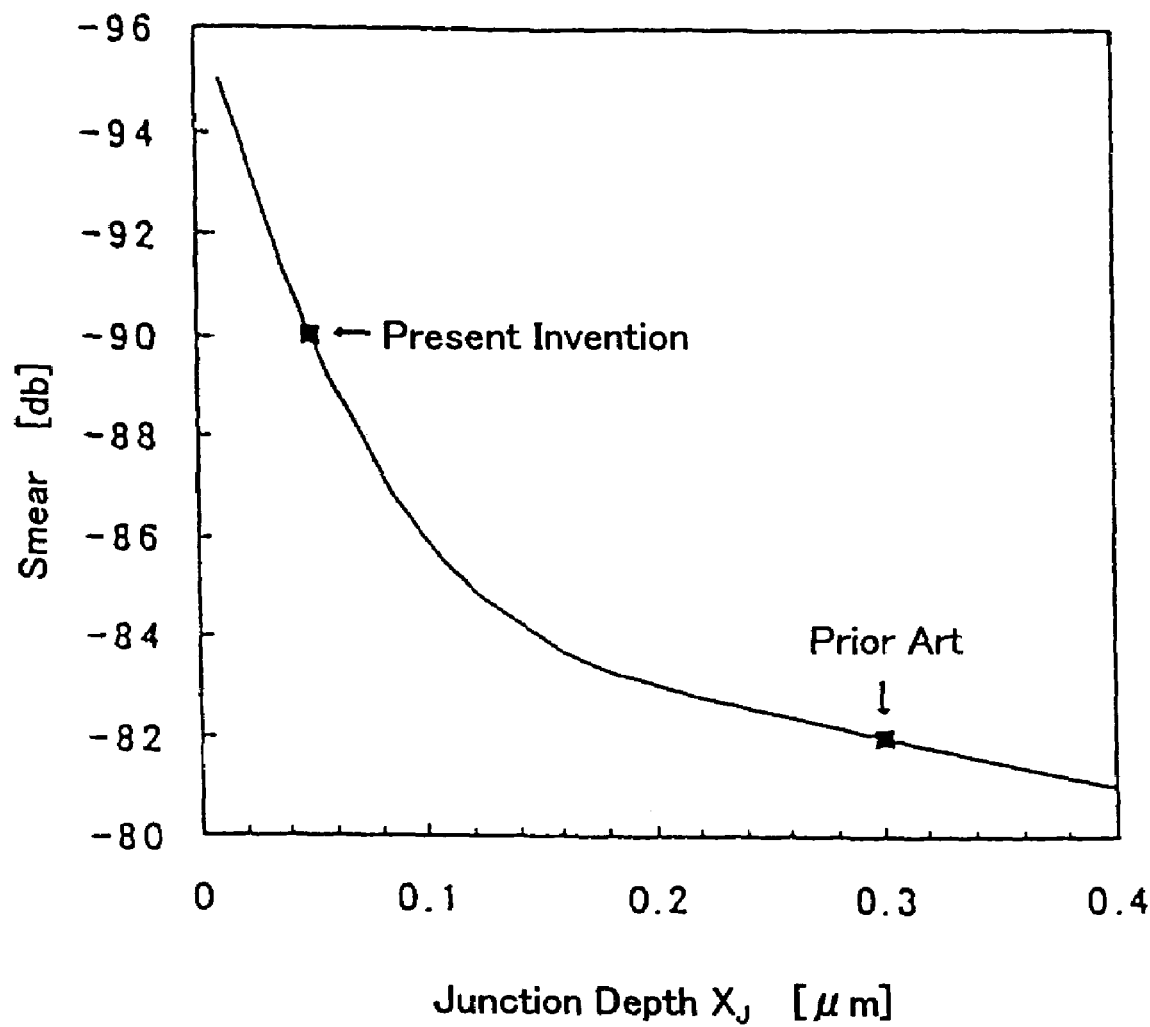
FIG. 6 is a graph illustrating a smear reduction effect achieved by the solid-state imaging device according to the first embodiment of the present invention.

A first effect is that the $P^{++}$-type inversion region 329 as the hole accumulation region for the dark current suppression has a decreased depth, which minimizes the flow of surface diffusion current 323 into the transfer channel region 304, the surface diffusion current 323 being caused by the signal charges 322 generated as a result of the photoelectric conversion. Consequently, smear can be reduced. FIG. 6 is a graph showing the relationship between the magnitude of the smear and the depth ($X_J$) of the hole accumulation region for the dark current suppression. As shown in the graph, for instance, in the case where the $P^{++}$-type inversion region 329 as the hole accumulation region has a depth of 0.1 µm, the smear is reduced by approximately 4 dB as compared with the case where the hole accumulation region has a depth of 0.3 µm.

Figure 7:
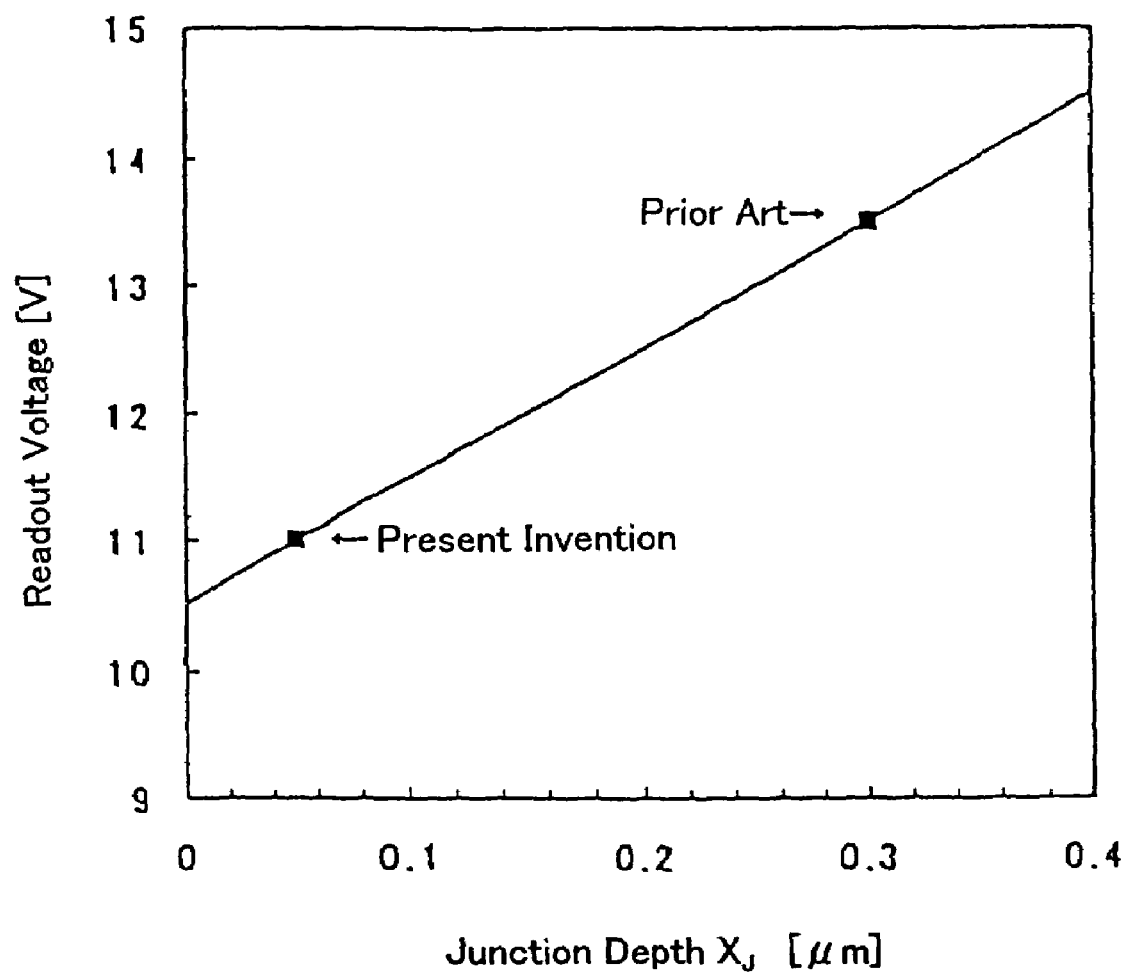
FIG. 7 is a graph illustrating a readout voltage reduction effect achieved by the solid-state imaging device according to the first embodiment of the present invention.

A second effect is that upon the readout of the signal charges 322 from the photoelectric conversion region 303 to the transfer channel region 304, a charge readout path 324 can be formed in the vicinity of the surface of the readout region 305, thereby facilitating the readout of the signal charges 322. FIG. 7 is a graph showing the relationship between the level of the readout voltage and the depth ($X_J$) of the hole accumulation region for the dark current suppression. As shown in the graph, for instance, in the case where the $P^{++}$-type inversion region 329 as the hole accumulation region has a depth of 0.1 µm, the readout voltage can be reduced by approximately 2.0 V as compared with the case where the hole accumulation region has a depth of 0.3 µm.

Furthermore, in the solid-state imaging device of the present embodiment, the $P^{++}$-type inversion region 329 as the hole accumulation region for trapping dark current is configured so as to be self-aligned with respect to the transfer electrode 311 since it is formed by the voltage application to the light-blocking film and the transparent conductive film. More specifically, unlike the conventional hole accumulation region formed by implanting ions of a P-type impurity, the hole accumulation region does not extend to under the transfer electrode, and a space 325 between the hole accumulation region and the transfer channel region is not narrowed. Therefore, the application of the readout voltage (normally about 15 V) to the transfer electrode 311 for reading out the signal charges 322 does not cause hot electrons to be generated by a strong electric field between the $P^{++}$-type inversion region 329 and the N-type transfer channel 304. Furthermore, at the same time, it is possible to suppress the variation of the readout voltage since the $P^{++}$-type inversion region 329 is configured so as to be self-aligned with respect to the transfer electrode 311.

Furthermore, the hole density of the $P^{++}$-type inversion region 329 is controlled readily by varying the negative voltage applied to the light-blocking film 315 and the transparent conductive film 321. Therefore, it is possible to achieve the high densification (for instance, $10^{18}$ cm$^{-3}$ or more) readily, thereby making it possible to suppress a phenomenon of an increase in dark current caused by the depletion of the topmost part of the $P^{++}$-type inversion region 329, even if impurity ions (positive ions) are diffused to the $P^{++}$-type inversion region 329 from the second interlayer insulation film 314. Therefore, this ensures the further reduction of dark current.

Furthermore, since the $P^{++}$-type inversion region 329 hardly erodes the N-type photoelectric conversion region 303, it is possible to reduce a dose of a N-type impurity implanted for forming the N-type photoelectric conversion region 303. Therefore, it is possible to further reduce voids that occur due to defects of the ion implantation, as well as dark current.

Furthermore, in the solid-state imaging device of the present embodiment, the transparent conductive film 321 is formed on the silicon substrate with the second interlayer insulation film 314 interposed therebetween, thereby suppressing the junction damage on the substrate surface in the photoelectric conversion section 309, which results in the suppression of dark current caused by the junction damage.

Next, the following will describe an example of a method for manufacturing the solid-state imaging device.

Ions of a P-type impurity such as boron are implanted in the N$^-$-type silicon substrate, thereby forming a P$^-$-type well region. Subsequently, ions of a P-type impurity such as boron are implanted in the P$^-$-type well region, thereby forming a readout region, a channel stop region, and a P-type well region. Furthermore, ions of a N-type impurity such as phosphorus, arsenic, etc. are implanted in the P$^-$-type well region, thereby forming a photoelectric conversion region and a transfer channel region.

Subsequently, a gate insulation film composed of a silicon oxide film is formed by the thermal oxidation method on the silicon substrate, and thereafter, a polycrystalline silicon film is formed by the chemical vapor deposition method (hereinafter referred to as "CVD method") or the like, which then is patterned so as to form a transfer electrode. Then, a silicon oxide, a silicon nitride, or the like is deposited thereon by the CVD method or the like so as to cover the transfer electrode, thereby forming a first interlayer insulation film.

Subsequently, a silicon oxide, a silicon nitride, or the like is deposited by the CVD method or the like, thereby forming a second interlayer insulation film. Subsequently, a film is formed with aluminum, tungsten, tungsten silicide, or the like by the sputtering method, the CVD method or the like, and the film thus formed is subjected to photolithography and etching so that an opening is formed at a position corresponding to at least an upper portion of the photoelectric conversion region except for a periphery thereof. Thus, a light-blocking film is formed.

Subsequently, a transparent conductive film made of indium tin oxide (ITO) or the like is formed by sputtering or the like on the conductive light-blocking film, and on the second interlayer insulation film in the opening of the light-blocking film.

Thereafter, a silicon oxide, a silicon nitride, or the like is deposited by the CVD method or the like so as to form a protective film. Furthermore, a silicon oxide or a silicon nitride is deposited by the CVD method so as to form a film, and a surface thereof is flattened by chemical mechanical abrasion or the like, whereby a flattening film is formed. Then, a color filter is formed on the flattening film by photolithography by employing a color resist, and a microlens is formed thereon. A microlens can be formed by applying a fusible resin, dividing the same so as to correspond to light-receiving sections, respectively, and thereafter subjecting the same to a reflowing treatment by heating.

Figure 8:
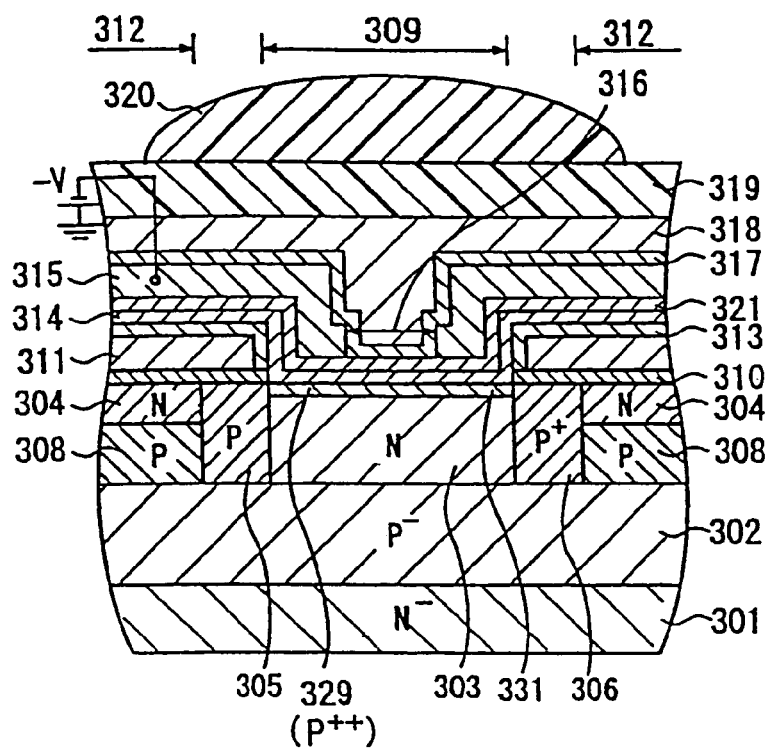
FIG. 8 is a cross-sectional view illustrating another example of the solid-state imaging device according to the first embodiment of the present invention.

It should be noted that the foregoing description refers to, as an example, a case where the conductive light-blocking film 315 is formed on the second interlayer insulation film 314, and the transparent conductive film 321 is formed thereon, but the solid-state imaging device of the present embodiment is not limited to this. Any configuration is applicable as long as a transparent conductive film is formed above at least a part of a photoelectric conversion region with the second interlayer insulation film interposed therebetween, and the transparent conductive film is connected electrically with the conductive light-blocking film. For instance, as shown in FIG. 8, the transparent conductive film 321 may be formed on the second interlayer insulation film 314, and the conductive light-blocking film 315 may be formed thereon. Such a configuration also ensures the attainment of the aforementioned effects, and further, it causes etching damages occurring upon the formation of the opening 316 to be absorbed in the transparent conductive film 321, thereby providing a photoelectric conversion section with less dark current.

It should be noted that the foregoing description refers to, as an example, a case where the photoelectric conversion region and the transfer channel region have the N-type conductivity, but the present invention is not limited to this, and the regions may have the P-type conductivity. In this case, the regions formed in the semiconductor substrate (the well region, the readout region, the channel stop region, etc.) may have the conductivities opposite to those in the aforementioned case, respectively. Thus, in the case where the photoelectric conversion region and the transfer channel region have the P-type conductivity, the same effects as those can be attained by employing a positive voltage as the voltage applied to the conductive light-blocking film and the transparent conductive film.

Second Embodiment

In a solid-state imaging device according to the present embodiment, as in the first embodiment, the photoelectric conversion region and the vertical transfer register constitute an imaging region, and the horizontal transfer register and the output section are arranged in the vicinity of the imaging region.

Figure 9:
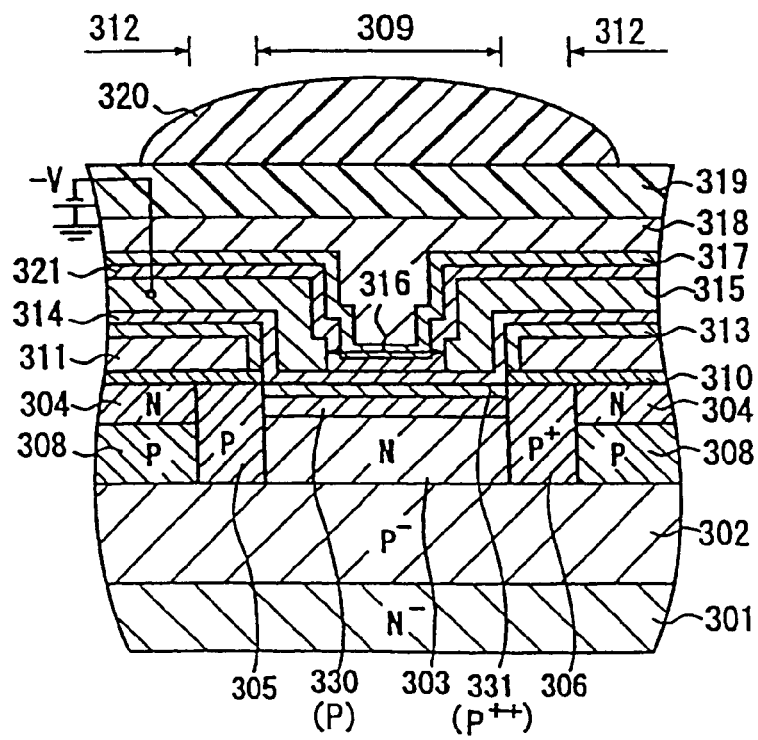
FIG. 9 is a cross-sectional view illustrating an example of a solid-state imaging device according to a second embodiment of the present invention.

FIG. 9 is a cross-sectional view illustrating an example of a structure of the imaging region of a solid-state imaging device according to the second embodiment of the present invention.

The solid-state imaging device of the present embodiment has the same configuration as that of the first embodiment except for a P-type impurity diffusion region 330 formed in the topmost part of the photoelectric conversion region 303. Furthermore, the same materials as those used in the first embodiment can be used as the materials for the respective parts.

The P-type impurity diffusion region 330 has an impurity density of, for instance, $10^{16}$ to $10^{19}$ cm$^{-3}$, preferably $10^{17}$ to $10^{18}$ cm$^{-3}$. Besides, it has a depth of, for instance, not more than 0.5 µm, preferably not more than 0.3 µm.

In the solid-state imaging device of the present embodiment, the conductive light-blocking film 315 and the transparent conductive film 321 are formed on the P-type impurity diffusion region 330 with the second interlayer insulation film 314 interposed therebetween, whereby a MOS capacitor structure is formed. With this configuration, the application of a negative voltage to the conductive light-blocking film 315 and the transparent conductive film 321 causes a P$^{++}$-type accumulation region 331 to be formed in the topmost part of the P-type impurity diffusion region 330. The P$^{++}$-type accumulation region 331 formed by the voltage application functions as a hole accumulation region for trapping dark current generated on a substrate surface in the photoelectric conversion region 309.

The P$^{++}$-type accumulation region 331 has a depth ($X_J$) of, for instance, not more than 0.1 µm, preferably 0.01 to 0.05 µm. Furthermore, it has a hole density of, for instance, not less than $10^{18}$ cm$^{-3}$, preferably $10^{18}$ to $10^{19}$ cm$^{-3}$. Furthermore, the negative voltage applied to the conductive light-blocking film 315 and the transparent conductive film 321 is not limited particularly, but preferably it is set so that the hole density of the P$^{++}$-type accumulation region 331 thus formed falls in the foregoing range. More specifically, the negative voltage may be set to be, for instance, −1 to −10 V, preferably −2 to −8 V.

The same driving method as that used in the first embodiment can be used as the driving method for the foregoing solid-state imaging device.

In the present embodiment as well, the same effects as those attained in the first embodiment as described above can be attained. Furthermore, according to the present embodiment, an absolute value of the voltage applied to the light-blocking film and the transparent conductive film can be decreased as compared with the first embodiment. Therefore, it is possible to reduce the strength of an electric field generated between the light-blocking film 315 and the transfer electrode 311 and an electric field generated between the light-blocking film 315 and the silicon substrate, thereby allowing for the improvement of reliability of the solid-state imaging device.

Third Embodiment

In a solid-state imaging device according to the present embodiment, as in the first embodiment, the photoelectric conversion regions and the vertical transfer registers constitute an imaging region, and the horizontal transfer register and the output section are arranged in the vicinity of the imaging region.

Figure 10:
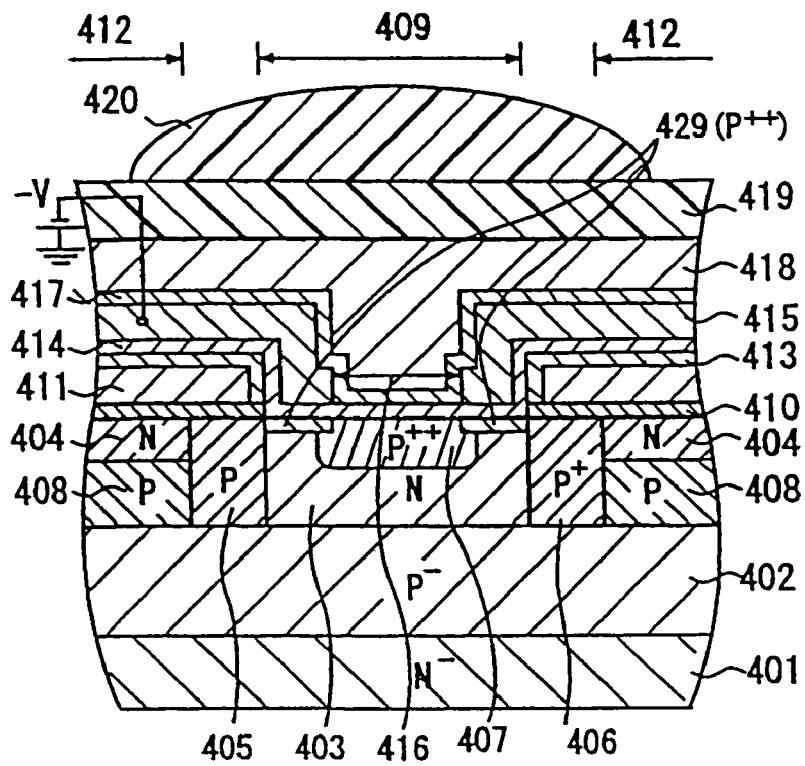
FIG. 10 is a cross-sectional view illustrating an example of a solid-state imaging device according to a third embodiment of the present invention.

FIG. 10 is a cross-sectional view illustrating an example of a structure of the imaging region of a solid-state imaging device according to the third embodiment of the present invention.

A P$^-$-type well region 402 is formed inside a N$^-$-type silicone substrate 401, and a N-type photoelectric conversion region 403 is formed in the P$^-$-type well region. This part constitutes a photoelectric conversion section 409. It should be noted that the photoelectric conversion region 403 has an impurity density of, for instance, $10^{15}$ to $10^{18}$ cm$^{-3}$, preferably $10^{16}$ to $10^{17}$ cm$^{-3}$. Furthermore, a N-type transfer channel region 404, a P-type readout region 405, and a P$^+$-type channel stop region 406 are formed in the P$^-$-type well region 402, and P-type well region 408 are formed immediately under the N-type transfer channel region 404. A transfer electrode 411 is formed above the N-type transfer channel region 404 with a gate insulation film 410 interposed therebetween. These parts constitute vertical transfer registers 412. Furthermore, an interlayer insulation film 413 is formed on a surface of the transfer electrode 411.

Figure 11:
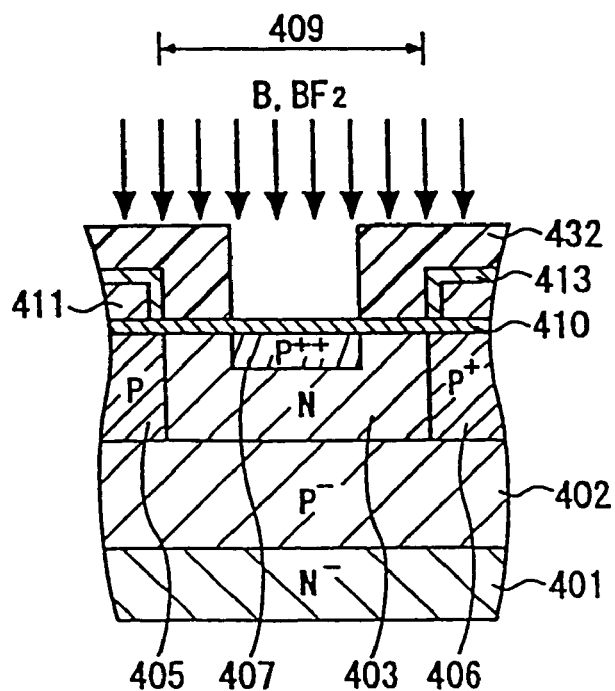
FIG. 11 is a schematic view illustrating a first method for forming a $P^{++}$-type impurity diffusion region.

Furthermore, in a solid-state imaging device according to the present embodiment, a P$^{++}$-type impurity diffusion region 407 is formed in a topmost part of the photoelectric conversion region 403. The P$^{++}$-type impurity diffusion region 407 is formed in an area of the photoelectric conversion region 403 excluding the periphery thereof, as shown in FIG. 11. In other words, the P$^{++}$-type impurity diffusion region 407 is not formed in an area including the periphery of the photoelectric conversion region 403. A distance from an end of the P$^{++}$-type impurity diffusion region 407 to an end of the photoelectric conversion region 403 (hereinafter referred to as "offset distance") is, for instance, not less than 0.2 µm, preferably 0.3 to 0.5 µm. Furthermore, the P$^{++}$-type impurity diffusion region 407 has an impurity density of, for instance, $10^{17}$ to $10^{20}$ m$^{-3}$, preferably $10^{18}$ to $10^{19}$ cm$^{-3}$, and a diffusion depth of, for instance, not more than 0.5 µm, preferably not more than 0.3 µm.

A second interlayer insulation film 414 is formed on the photoelectric conversion region 403 in the photoelectric conversion region 409, and on the first interlayer insulation film 413 in the vertical transfer register 412. On the second interlayer insulation film 414, a conductive light-blocking film 415 is formed. The conductive light-blocking film 415 is formed so as to cover a surface of the transfer electrode 411 so that light should not be incident directly on the vertical transfer register 412. It should be noted that the second interlayer insulation film 414 has a thickness of, for instance, 10 to 300 nm, preferably 50 to 100 nm.

Furthermore, an opening 416 is provided in the conductive light-blocking film 415 at a position corresponding to at least a portion of the P$^{++}$-type impurity diffusion region 407. The opening 416 is provided in an area of the photoelectric conversion region 403 excluding the periphery thereof. In other words, the conductive light-blocking film 415 is formed so as to cover the area including the periphery of the photoelectric conversion region 403, that is, the area where the P$^{++}$-type impurity diffusion region 407 is not formed. Furthermore, the area including the periphery of the photoelectric conversion region 403, the second interlayer insulation film 414 is present between the photoelectric conversion region 403 and the conductive light-blocking film 415. Furthermore, the conductive light-blocking film 415 is laid out so that a driving pulse φPS is applied thereto, or alternatively, it is connected electrically with a negative power source as shown in FIG. 10.

A protective film 417 is formed on the conductive light-blocking film 415, as well as on the second interlayer insulation film 414 in the opening 416. A flattening film 418 is formed on the protective film 417, and a color filter layer 419 is formed on the flattening film 418. Furthermore, a microlense 420 is formed on the color filter layer 419 so as to correspond to the photoelectric conversion region 409.

In the solid-state imaging device according to the present embodiment, the P$^{++}$-type impurity diffusion region 407 is formed in the topmost part of the substrate at the center of the photoelectric conversion region 403 (i.e., a portion corresponding to the opening of the light-blocking film). The P$^{++}$-type impurity diffusion region 407 functions as a hole accumulation region for trapping dark current.

Furthermore, in the area including the periphery of the photoelectric conversion region 403 (i.e., the area covered with the light-blocking film), the conductive light-blocking film 415 is formed on the substrate with the second interlayer insulation film 414 interposed therebetween, whereby a MOS capacitor structure is formed. Therefore, it is possible to form a P$^{++}$-type inversion region 429 in a topmost part of the substrate by applying a negative voltage to the light-blocking film 415, and to cause the P$^{++}$-type inversion region 429 to function as a hole accumulation region for trapping dark current.

The P$^{++}$-type inversion region 429 has a depth ($X_j$) of, for instance, not more than 0.1 µm, preferably not more than 0.05 µm. Furthermore, it has a hole density of, for instance, not less than $10^{18}$ cm$^{-3}$, preferably $10^{18}$ to $10^{19}$ cm$^{-3}$. Furthermore, the negative voltage applied to the light-blocking film 415 is not limited particularly, but it preferably is set so that the hole density of the formed P$^{++}$-type inversion region 429 falls in the aforementioned range. More specifically, the negative voltage can be set to be, for instance, −1 to −10V, preferably −2 to −8 V.

The same driving method as that used in the first embodiment as described above can be used as the driving method for the foregoing solid-state imaging device.

Figure 16:
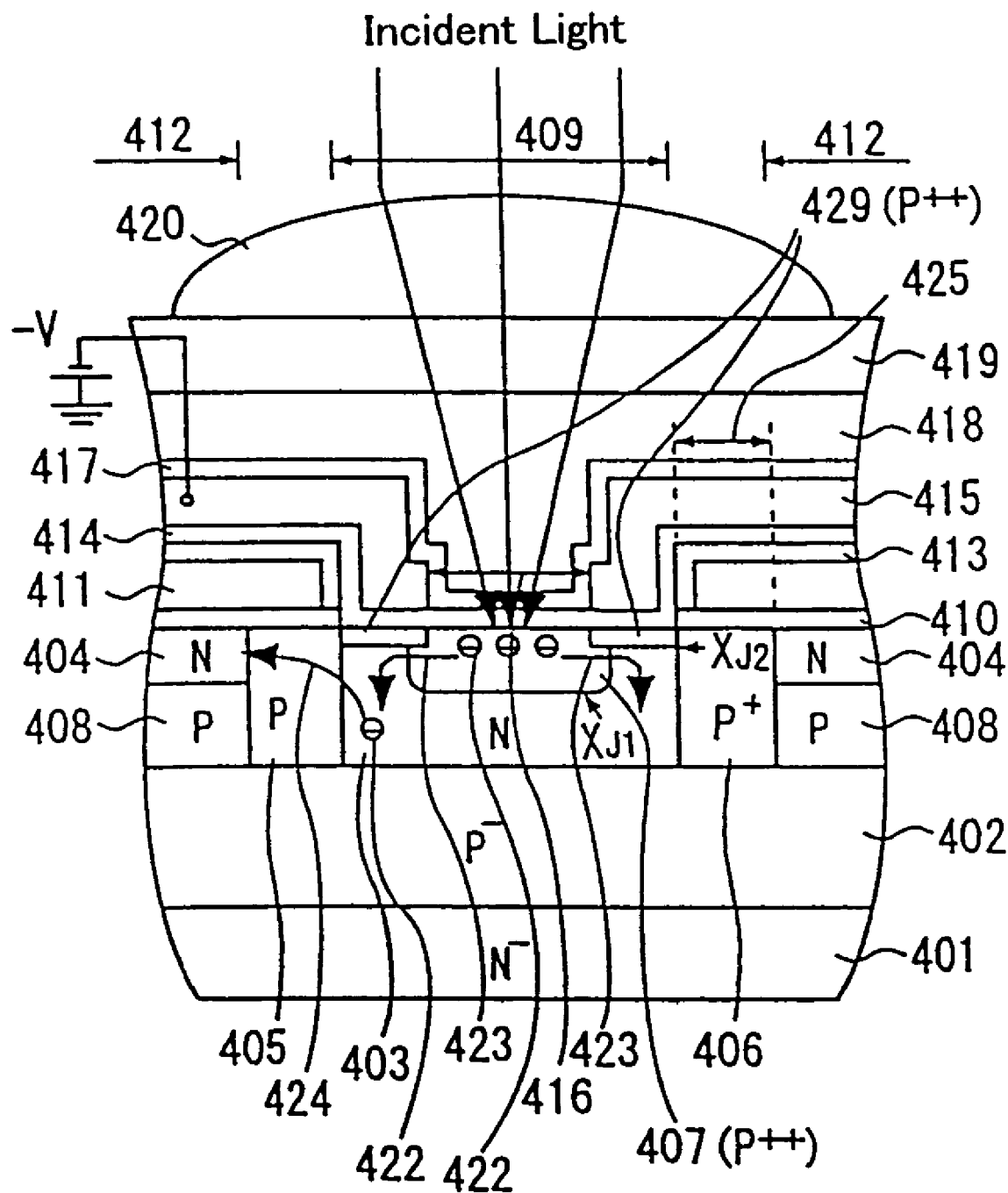
FIG. 16 is a schematic view for explaining effects achieved by the solid-state imaging device according to the third embodiment of the present invention.

Next, effects achieved by the solid-state imaging device according to the present embodiment are described below, with reference to FIG. 16.

In the solid-state imaging device according to the present embodiment, as described above, the P$^{++}$-type impurity diffusion region 407 is formed at the center of the photoelectric conversion region 403 (i.e., the area corresponding to the opening of the light-blocking film), and the P$^{++}$-type impurity diffusion region 407 functions as a hole accumulation region for trapping dark current. Furthermore, in the area including the periphery of the photoelectric conversion region 403 (i.e., the area covered with the light-blocking film), it is possible to form the P$^{++}$-type inversion region 429 by applying a negative voltage to the light-blocking film 415, and to make the P$^{++}$-type inversion region 429 function as a hole accumulation region for trapping dark current. Therefore, it is possible to reduce the depth of the hole accumulation region to, for instance, 0.1 µm or less.

Thus, as a result of forming the P$^{++}$-type impurity diffusion region 407 with an offset from the photoelectric conversion region 403, and forming the P$^{++}$-type inversion region 429 in the offset area by applying a negative voltage to the light-blocking film, the following effects can be achieved.

Figure 17:
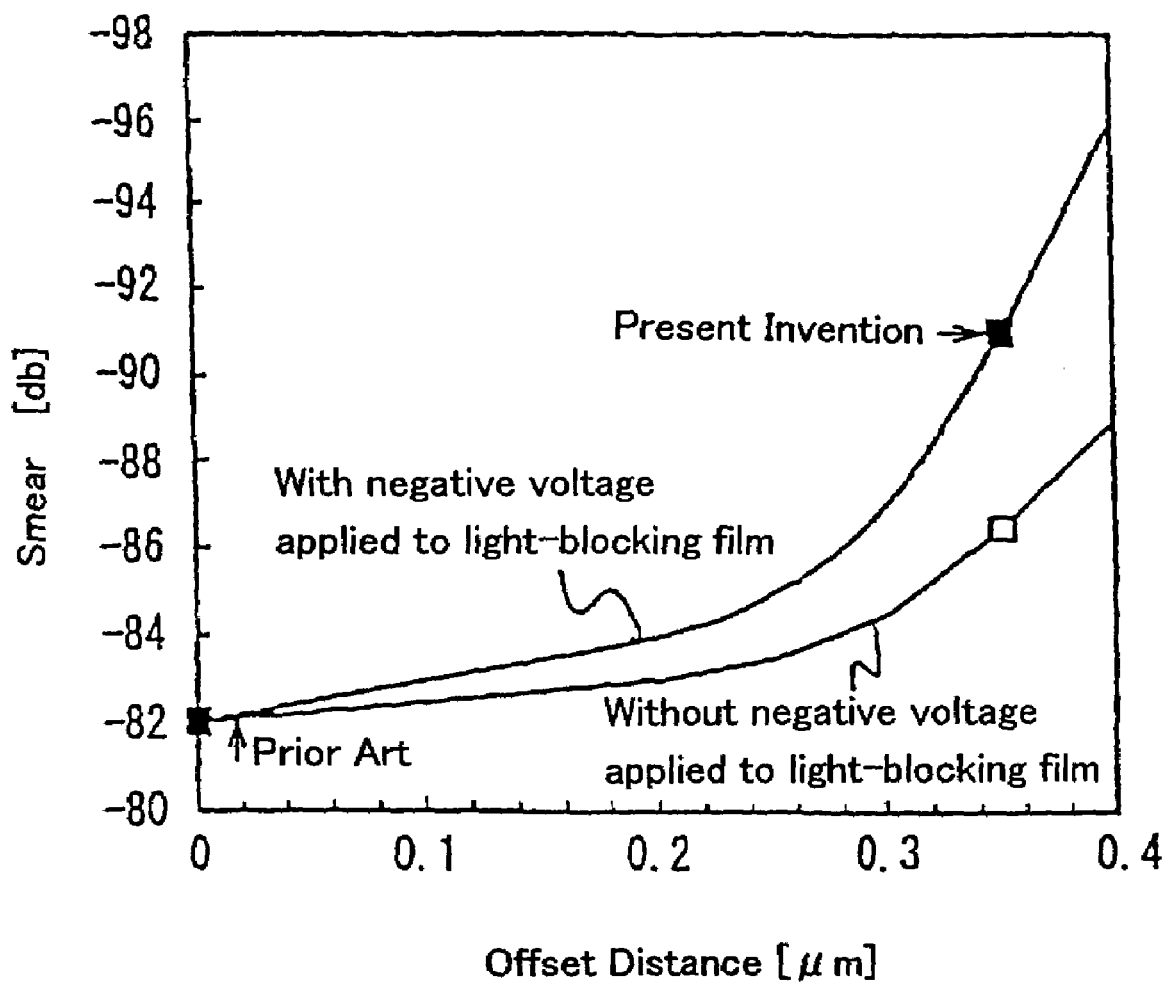
FIG. 17 is a graph illustrating a smear reduction effect achieved by the solid-state imaging device according to the third embodiment of the present invention.

A first effect is that the flow of surface diffusion current 423 into the transfer channel region 404, the surface diffusion current 423 being caused by signal charges 422 generated as a result of the photoelectric conversion, is reduced, which results in the reduction of smear. FIG. 17 is a graph illustrating the relationship between the magnitude of smear and the offset distance between the P$^{++}$-type impurity diffusion region 407 and the photoelectric conversion region 403 in the case where a negative voltage is applied to the light-blocking film and in the case where a negative voltage is not applied to the light-blocking film. As shown in the graph, for instance, in the case where the offset distance is set to be 0.3 µm, and the negative voltage is applied to the light-blocking film, it is possible to reduce smear by approximately 5 dB, as compared with the case where the offset distance is 0 µm.

Figure 18:
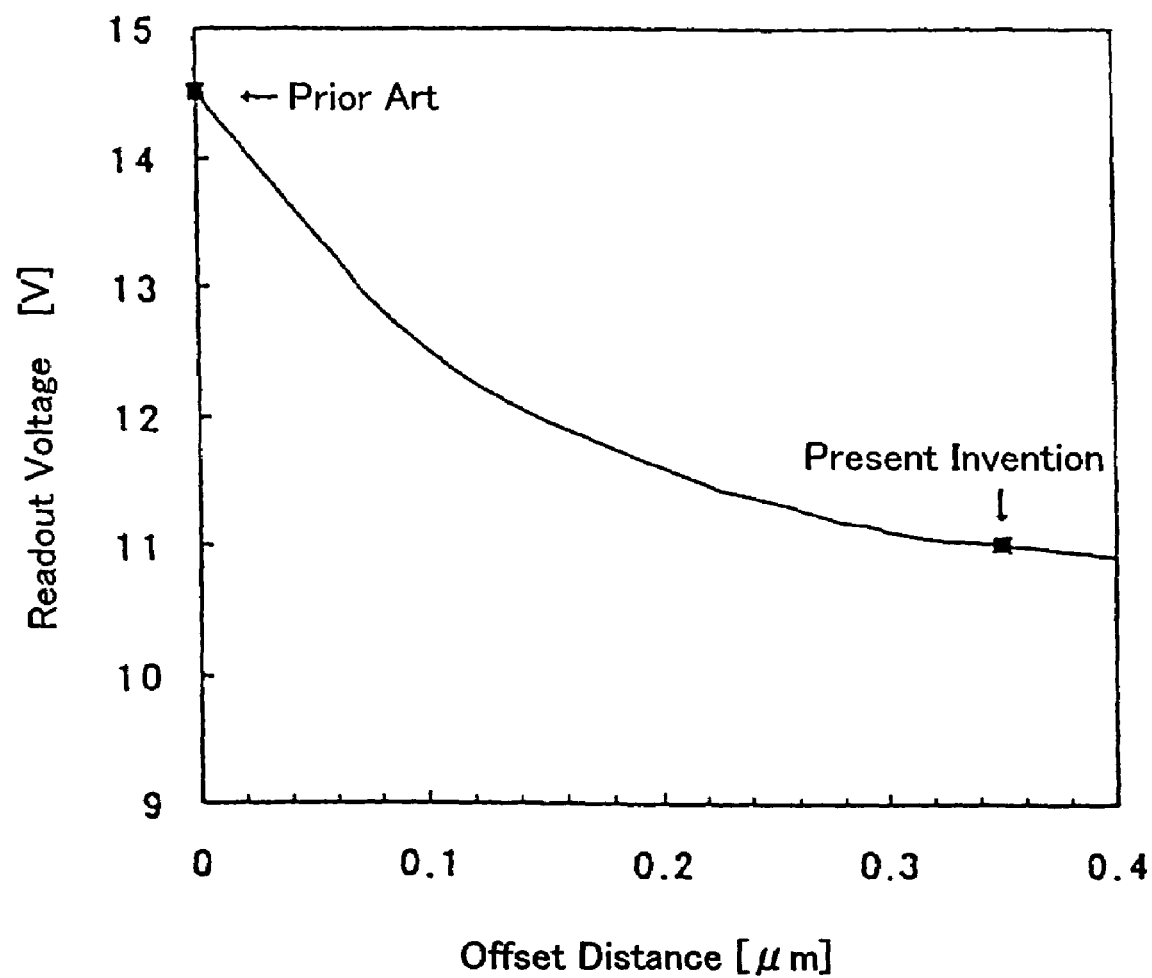
FIG. 18 is a graph illustrating a readout voltage reduction effect achieved by the solid-state imaging device according to the third embodiment of the present invention.

A second effect is that upon the readout of the signal charges 422 from the photoelectric conversion region 403 to the transfer channel region 404, a charge readout path 424 can be formed in the vicinity of the surface of the readout region 405, thereby facilitating the readout of the signal charges 422. FIG. 18 is a graph showing the relationship between the level of the readout voltage and the offset distance between the P$^{++}$-type impurity diffusion region 407 and the photoelectric conversion region 403. As shown in the graph, for instance, in the case where the offset distance is set to be 0.3 µm, it is possible to reduce the readout voltage by approximately 3.5 V, as compared with the case where the offset distance is 0 µm.

Furthermore, in the solid-state imaging device of the present embodiment, a space 425 between the hole accumulation region (P$^{++}$-type region) and the N-type transfer channel region is not narrowed. Therefore, the application of the readout pulse (normally about 15 V) to the transfer electrode 411 for reading out the signal charges 422 does not cause hot electrons to be generated by a strong electric field between the P$^{++}$-type inversion region 429 and the N-type transfer channel 404. Furthermore, at the same time, it is possible to suppress the variation of the readout voltage since the P$^{++}$-type inversion region 429 is configured so as to be self-aligned with respect to the transfer electrode 411.

Furthermore, the hole density of the P$^{++}$-type inversion region 429 can be controlled readily by varying the negative voltage applied to the light-blocking film 415. Therefore, it is possible to achieve the high densification (for instance, $10^{18}$ cm$^{-3}$ or more) readily, thereby allowing for the further reduction of dark current.

Furthermore, since the P$^{++}$-type inversion region 429 hardly erodes the N-type photoelectric conversion region 403, it is possible to reduce a dose of a N-type impurity implanted for forming the N-type photoelectric conversion region 403. Therefore, it is possible to further reduce voids that occur due to defects of the ion implantation, as well as dark current.

Furthermore, since the light-blocking film 415 is formed directly on the surface of the second interlayer insulation film 414, it is possible to set a distance 427 between the transfer electrode and the light-blocking film as well as a distance 428 between the light-blocking film and the silicon substrate to be relatively smaller. Therefore, it is possible to avoid problems such as the degradation of a covering property of the light-blocking film 415 and the reduction in size of the opening 416 in the light-blocking film.

The following will describe an example of a method for manufacturing the foregoing solid-state imaging device.

A P$^-$-type well region is formed in a N$^-$-type silicon substrate, and a readout region, a channel stop region, and a P-type well region are formed in the P$^-$-type well region. Furthermore, a photoelectric conversion region and a transfer channel region are formed in the P$^-$-type well region. Subsequently, after forming a gate insulation film on the silicon substrate, a transfer electrode is formed. Next, a first interlayer insulation film is formed so as to cover the transfer electrode. The process described so far can be carried out in the same manner as that in the first embodiment. Subsequently, a P$^{++}$-type impurity diffusion region is formed. This process can be implemented by, for instance, the following first through fifth methods.

FIG. 11 is a schematic view for explaining the first method. In the first method, first, a photoresist 432 is formed on a silicon substrate so that the photoresist 432 has an opening at a position corresponding to the photoelectric conversion region 403 except for the periphery thereof. Here, the opening in the photoresist 432 is not limited particularly, but it may be, for example, in a stripe form extending in the vertical direction of the pixels, or alternatively, in a box shape corresponding to a shape of the opening in the light-blocking film. Subsequently, ions of a P-type impurity such as B or BF$_2$ are implanted by employing the photoresist 432 as a mask. Conditions for the implantation are not limited particularly, but for instance, a dose and an acceleration voltage may be set to be $10^{13}$ to $10^{14}$ cm$^{-2}$ and 5 to 50 keV, respectively.

Figure 12:
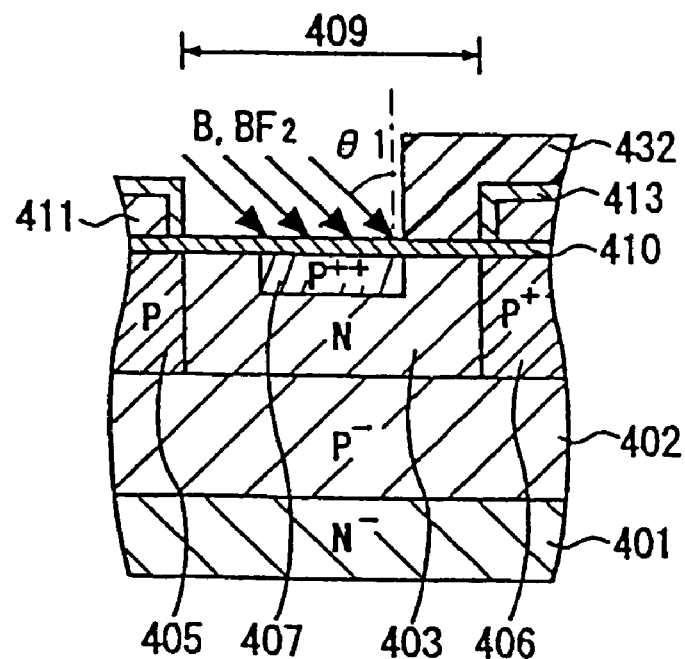
FIG. 12 is a schematic view illustrating a second method for forming a $P^{++}$-type impurity diffusion region.

FIG. 12 is a schematic view for explaining the second method. In the second method, first, a photoresist 432 is formed so as to cover an area above a channel-stop-region-406-side peripheral portion of the surface of the photoelectric conversion region 403. Subsequently, ions of a P-type impurity such as B or BF$_2$ are implanted by employing the photoresist 432 as a mask. Here, as shown in FIG. 12, the ions are implanted in a direction tilted toward the readout region 405 side with respect to a direction perpendicular to the substrate surface. The tilt angle (θ1) is not limited particularly, but for instance, 5 to 45° C., preferably 7 to 30° C. It should be noted that the dose and the acceleration voltage may be set in the same manner as that in the first method. According to this method, an edge of the P$^{++}$-type impurity diffusion region 407 on the readout region 405 side is determined so as to be self-aligned with respect to the transfer electrode 411, thereby achieving an effect of the suppression of the variation of the readout voltage.

Figure 13:
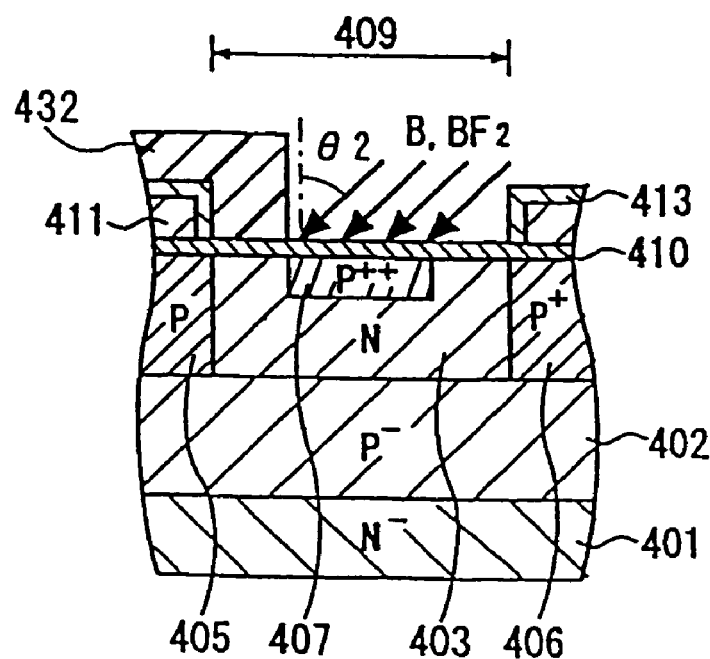
FIG. 13 is a schematic view illustrating a third method for forming a $P^{++}$-type impurity diffusion region.

FIG. 13 is a schematic view for explaining the third method. In the third method, first, a photoresist 432 is formed so as to cover an area above a readout-region-405-side peripheral portion of the photoelectric conversion region 403. Subsequently, ions of a P-type impurity such as B or BF$_2$ are implanted by employing the photoresist 432 as a mask. Here, as shown in FIG. 13, the ions are implanted in a direction tilted toward the channel stop region 406 side with respect to a direction perpendicular to the substrate surface. The tilt angle (θ2) is not limited particularly, but for instance, 5 to 45° C., preferably 7 to 30° C. It should be noted that the dose and the acceleration voltage may be set in the same manner as that in the first method. According to this method, an edge of the P$^{++}$-type impurity diffusion region 407 on the channel stop region 406 side is determined so as to be self-aligned with respect to the transfer electrode 411, thereby achieving an effect of the constant suppression of hot electrons generated by a strong electric field generated between the P$^{++}$-type impurity diffusion region 407 and the N-type transfer channel region 404.

Furthermore, it is possible to use the second and third methods in combination. More specifically, it is possible to carry out the ion implantation by the third method after carrying out the ion implantation by the second method. It should be noted that the order in which the ion implantation by the second method and the ion implantation by the third method are executed is not limited particularly. This makes it possible that by controlling the tilt angles for the ion implantation (θ1 and θ2), the P$^{++}$-type hole accumulation region 407 can be formed with a necessary offset distance ensured from the transfer electrode 411 so as to be self-aligned with respect to the transfer electrode 411. Therefore, it is possible to stabilize the readout voltage and the characteristics of the photoelectric conversion region such as smear, while suppressing hot electrons stably.

Figure 14:
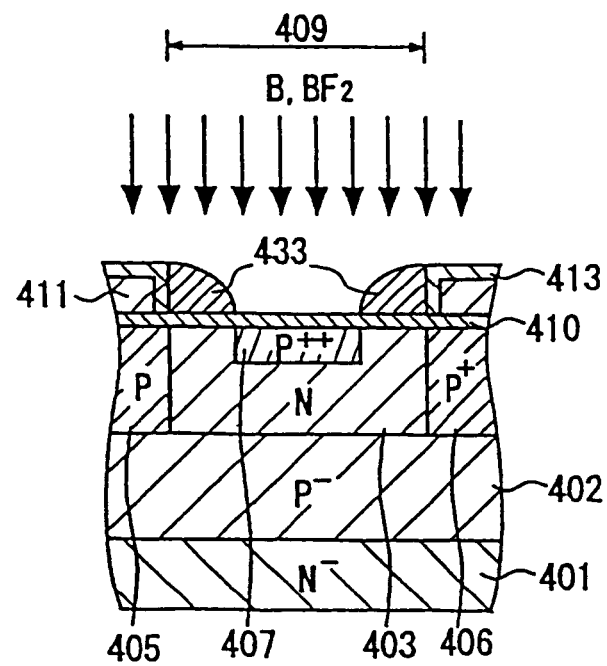
FIG. 14 is a schematic view illustrating a fourth method for forming a $P^{++}$-type impurity diffusion region.

FIG. 14 is a schematic view for explaining the fourth method. In the fourth method, first, a side wall 433 is formed on a side face of the transfer electrode 411 with the first interlayer insulation film 413 interposed therebetween. The side walls 433 can be formed by, for instance, forming a film by the CVD method or the like and thereafter applying anisotropic etching such as dry etching to the film thus formed. Furthermore, a material of the side walls 433 is not limited particularly, but a silicon oxide, a silicon nitride, silicon, etc. may be used as the material. Subsequently, ions of a P-type impurity such as B or BF$_2$ are implanted by employing the transfer electrode 411 and the side wall 433 as masks. It should be noted that the dose and the acceleration voltage may be set in the same manner as that in the first method. According to this method, by controlling a thickness of the side walls 433, the P$^{++}$-type impurity diffusion region 407 can be formed with an appropriate offset distance from the transfer electrode 411 so as to be self-aligned with respect to the transfer electrode 411. This makes it possible to stabilize the readout voltage and the characteristics of the photoelectric conversion region such as smear, while suppressing the generation of hot electrons stably.

Subsequently, a silicon oxide film, a silicon nitride film, or the like is formed by the CVD method or the like as a second interlayer insulation film. Then, aluminum, tungsten, tungsten silicide or the like is deposited by sputtering, the CVD method, or the like so as to form a film, and the film thus formed is subjected to photolithography and etching so that an opening is formed at a position corresponding to at least an upper portion of the photoelectric conversion region except for a periphery thereof. Thus, a light-blocking film is formed.

Thereafter, a protective film, a flattening film, a color filter layer, and microlenses are formed. The process for forming these can be carried out in the same manner as that in the first embodiment.

Figure 15:
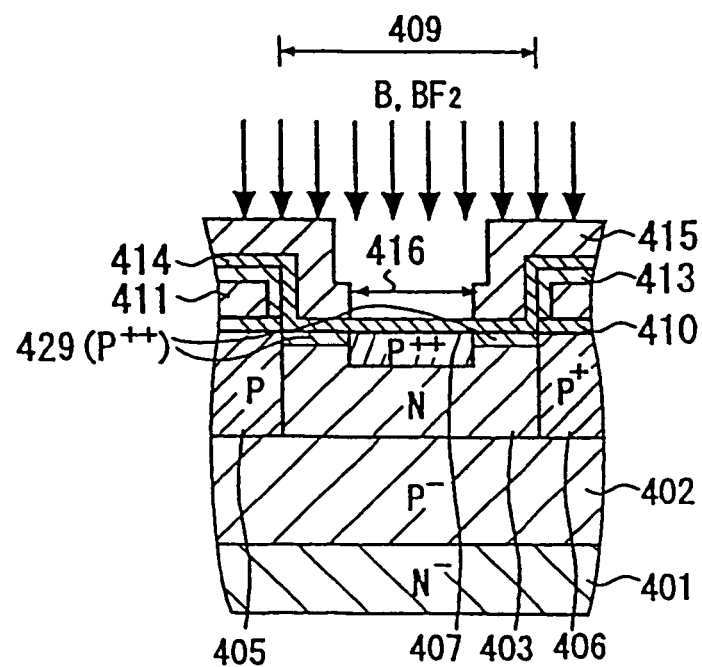
FIG. 15 is a schematic view illustrating a fifth method for forming a $P^{++}$-type impurity diffusion region.

The foregoing description explains the formation of the $P^{++}$-type impurity diffusion region by taking as an example a case where it is carried out before the light-blocking film is formed, but it may be carried out after the formation of the light-blocking film. FIG. 15 is a schematic view for explaining such a manufacturing method.

First, a $P^-$-type well region 402, a photoelectric conversion region 403, a transfer channel region, a readout region 405, a channel stop region 406, and a P-type well region are formed in the silicon substrate 401. Subsequently, a gate insulation film 410, a transfer electrode 411, and a first interlayer insulation film 413 are formed on the silicon substrate 401. It should be noted that the process for forming these can be implemented in the same manner as that of the aforementioned manufacturing method.

Subsequently, a silicon oxide film, a silicon nitride film, or the like is formed by the CVD method or the like as a second interlayer insulation film 414. Then, aluminum, tungsten, tungsten silicide or the like is deposited by sputtering, the CVD method, or the like so as to form a film, and the film thus formed is subjected to photolithography and etching so that an opening 416 is formed at a position corresponding to at least a portion of the photoelectric conversion region 403 except for a periphery thereof. Thus, a light-blocking film 415 is formed.

Thereafter, ions of a P-type impurity such as B or $BF_2$ are implanted by employing the light-blocking film 415 as a mask, whereby a $P^{++}$-type impurity diffusion region 407 is formed. Conditions for the implantation are not limited particularly, but for instance, a dose and an acceleration voltage may be set to be $10^{13}$ to $10^{14}$ cm$^{-2}$ and 5 to 50 keV, respectively. According to this method, the $P^{++}$-type impurity diffusion region 407 can be formed so as to be self-aligned with respect to the opening 416 in the light-blocking film 415. Consequently, it is possible to avoid the occurrence of a gap between a $P^{++}$-type inversion region 429 that is formed upon the application of a voltage to the light-blocking film and the $P^{++}$-type impurity diffusion region 407, thereby making it possible to avoid the occurrence of dark current, voids, etc. that result from such a gap.

Subsequently, a protective film, a flattening film, a color filter, and microlenses are formed, whereby a solid-state imaging device can be obtained. It should be noted that the process for forming these can be implemented in the same manner as that in the aforementioned manufacturing methods.

Fourth Embodiment

In a solid-state imaging device according to the present embodiment, an imaging region is composed of photoelectric conversion regions and vertical transfer registers, and a horizontal transfer register and an output section are arranged in the vicinity of the imaging region, as in the first embodiment.

Figure 19:
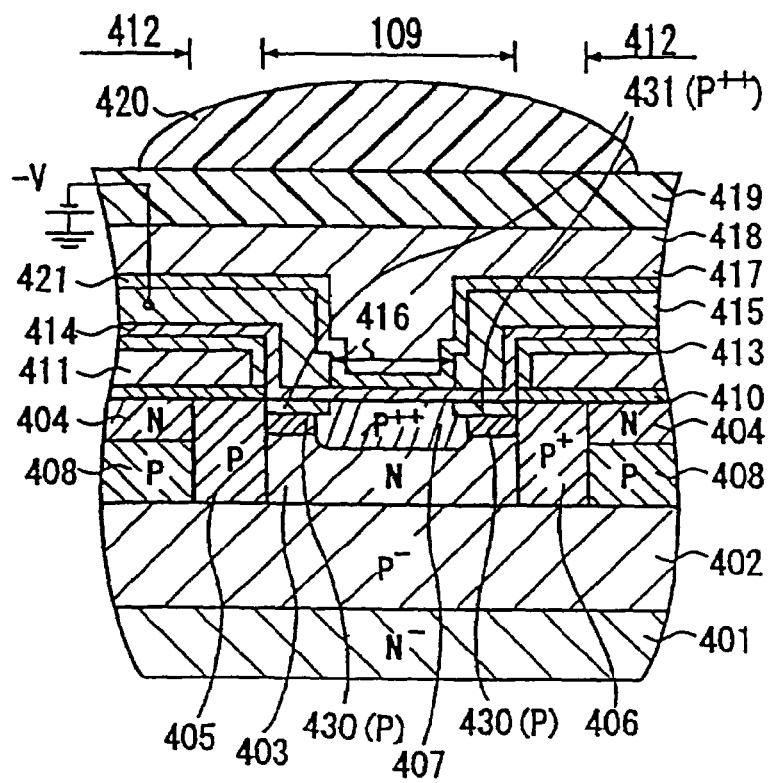
FIG. 19 is a cross-sectional view illustrating an example of a solid-state imaging device according to a fourth embodiment of the present invention.

FIG. 19 is a cross-sectional view illustrating an example of a structure of the imaging region of the solid-state imaging device according to the fourth embodiment of the present invention.

The solid-state imaging device of the present embodiment has the same structure as that of the third embodiment except for that a P-type impurity diffusion region 430 is formed in a topmost part of a region that includes the periphery of the photoelectric conversion region 403 (i.e., the region covered with the light-blocking film). Furthermore, the same materials as those used in the third embodiment can be used as materials for the respective parts.

The P-type impurity diffusion region 430 has an impurity density of, for instance, $10^{16}$ to $10^{19}$ cm$^{-3}$, preferably $10^{17}$ to $10^{18}$ cm$^{-3}$, and has a diffusion density of, for instance, not more than 0.5 μm, preferably not more than 0.3 μm.

In the solid-state imaging device of the present embodiment, the conductive light-blocking film 415 is formed on the P-type impurity diffusion region 430 with the second interlayer insulation film 414 interposed therebetween, whereby a MOS capacitor structure is formed. With this configuration, it is possible to for a $P^{++}$-type accumulation region 431 in a topmost part of the P-type impurity diffusion region 430 by applying a negative voltage to the conductive light-blocking film 415. The $P^{++}$-type accumulation region 431 formed by the voltage application functions as a hole accumulation region for trapping dark current generated on the substrate surface in the photoelectric conversion region 409.

The $P^{++}$-type accumulation region 431 has a depth ($X_j$) of, for instance, not more than 0.1 μm, preferably 0.01 to 0.05 μm, and a hole density of, for instance, not less than $10^{18}$ cm$^{-3}$, preferably $10^{18}$ to $10^{19}$ cm$^{-3}$. The negative voltage applied to the conductive light-blocking film 415 is not limited particularly, but it preferably is set so that the hole density of the formed $P^{++}$-type accumulation region 431 falls in the foregoing range. More specifically, the negative voltage may be set to be, for instance, $-1$ to $-10$ V, preferably $-2$ to $-8$ V.

It should be noted that the same driving method used in the first embodiment can be used as the driving method for the foregoing solid-state imaging device.

The same effects as attained in the third embodiment as described above can be achieved in the present embodiment as well. Furthermore, according to the present embodiment, since the absolute value of the voltage applied to the light-blocking film can be decreased as compared with the third embodiment, it is possible to reduce an electric field generated between the light-blocking film 415 and the transfer electrode 411 and an electric field generated between the light-blocking film 415 and the substrate, thereby improving the reliability of the solid-state imaging device.

What is claimed is:

1. A method for driving a solid-state imaging device, the solid-state imaging device comprising:
    a first-conductivity-type semiconductor substrate;
    a second-conductivity-type photoelectric conversion region formed in the first-conductivity-type semiconductor substrate;
    a transfer channel region formed in the substrate so as to be juxtaposed to the second-conductivity-type photoelectric conversion region;
    a transfer electrode formed on the transfer channel region with a gate insulation film interposed therebetween;
    a conductive light-blocking film that covers the transfer electrode and that has an opening above the second-conductivity-type photoelectric conversion region; and
    a transparent conductive film that is formed on the second-conductivity-type photoelectric conversion region with an interlayer insulation film interposed therebetween, and is connected electrically with the conductive light-blocking film, the method comprising the steps of:
(a) accumulating signal charges generated by photoelectric conversion in the second-conductivity-type photoelectric conversion region, while transferring signal charges through the transfer channel region; and
(b) reading out the accumulated signal charges into the transfer channel region, wherein in the step (a), a negative voltage is applied to the conductive light-blocking film and the transparent conductive film, and in the step (b), a voltage of not less than 0 V is applied to the conductive light-blocking film and the transparent conductive film.

2. A method for driving a solid-state imaging device, the solid-state imaging device comprising:

a first-conductivity-type semiconductor substrate;
a second-conductivity-type photoelectric conversion region formed in the first-conductivity-type semiconductor substrate, the second-conductivity-type photoelectric conversion region having a peripheral portion including a periphery thereof and a central portion excluding the periphery thereof;
an electrode formed on a region juxtaposed to the second-conductivity-type photoelectric conversion region in the substrate with a gate insulation film interposed therebetween;
a conductive light-blocking film that is formed above the peripheral portion of the second-conductivity-type photoelectric conversion region and above the electrode, with an interlayer insulation film interposed therebetween, and that has an opening above the central portion of the second-conductivity-type photoelectric conversion region; and
a first-conductivity-type semiconductor region that is an impurity diffusion region formed in a topmost part in the central portion of the second-conductivity-type photoelectric conversion region, the method comprising the steps of:
(a) accumulating signal charges generated by photoelectric conversion in the second-conductivity-type photoelectric conversion region, while transferring signal charges through the transfer channel region; and
(b) reading out the accumulated signal charges into the transfer channel region, wherein in the step (a), a negative voltage is applied to the conductive light-blocking film, and in the step (b), a voltage of not less than 0 V is applied to the conductive light-blocking film.

3. A method for manufacturing the solid-state imaging device, the solid-state imaging device comprising:

a first-conductivity-type semiconductor substrate;
a second-conductivity-type photoelectric conversion region formed in the first-conductivity-type semiconductor substrate, the second-conductivity-type photoelectric conversion region having a peripheral portion including a periphery thereof and a central portion excluding the periphery thereof;
an electrode formed on a region juxtaposed to the second-conductivity-type photoelectric conversion region in the substrate with a gate insulation film interposed therebetween;
a conductive light-blocking film that is formed above the peripheral portion of the second-conductivity-type photoelectric conversion region and above the electrode, with an interlayer insulation film interposed therebetween, and that has an opening above the central portion of the second-conductivity-type photoelectric conversion region; and
a first-conductivity-type semiconductor region that is an impurity diffusion region formed in a topmost part in the central portion of the second-conductivity-type photoelectric conversion region, the method comprising the steps of:
(a) forming a second-conductivity-type photoelectric conversion region in a first-conductivity-type semiconductor substrate, the second-conductivity-type photoelectric conversion region having a peripheral portion including a periphery thereof and a central portion excluding the periphery thereof;
(b) forming an electrode on a region juxtaposed to the second-conductivity-type photoelectric conversion region in the substrate, with a gate insulation film interposed therebetween;
(c) forming a conductive light-blocking film above the peripheral portion of the second-conductivity-type photoelectric conversion region and above the electrode, with an interlayer insulation film interposed therebetween;
(d) providing an opening in the conductive light-blocking film at a position corresponding to the central portion of the second-conductivity-type photoelectric conversion region; and
(e) forming a first-conductivity-type semiconductor region in a topmost part of the central portion of the second-conductivity-type photoelectric conversion region by implanting ions of a first-conductivity-type impurity therein.

4. The method according to claim 3, wherein the step (e) includes sub-steps of:
forming a photoresist that covers the peripheral portion of the second-conductivity-type photoelectric conversion region and has an opening above the central portion of the second-conductivity-type photoelectric conversion region; and
implanting ions of a first-conductivity-type impurity into the second-conductivity-type photoelectric conversion region, by using the photoresist as a mask.

5. The method according to claim 3, wherein the step (e) includes the sub-steps of:
forming a photoresist that covers at least one side part of the peripheral portion of the second-conductivity-type photoelectric conversion region and has an opening above the central portion of the second-conductivity-type photoelectric conversion region; and
implanting ions of a first-conductivity-type impurity into the second-conductivity-type photoelectric conversion region in a direction tilt with respect to a face of the semiconductor substrate, by using the photoresist as a mask.

6. The method according to claim 3, wherein the step (e) is carried out after the step (b) is carried out, and the step (e) includes the sub-steps of:
forming a side wall on a side face of the electrode; and
implanting ions of a first-conductivity-type impurity into the second-conductivity-type photoelectric conversion region, by using the electrode and the side wall as masks.

7. The method according to claim 3, wherein the step (e) is carried out after the step (d) is carried out, and the step (e) includes the sub-step of implanting ions of a first-conductivity-type impurity into the second-conductivity-type photoelectric conversion region, by using the conductive light-blocking film as a mask.

* * * * *